(12) United States Patent
Mabuchi

(10) Patent No.: US 8,902,341 B2
(45) Date of Patent: Dec. 2, 2014

(54) SOLID-STATE IMAGING DEVICE, DRIVING METHOD OF SOLID-STATE IMAGING DEVICE, AND ELECTRONIC APPARATUS

(75) Inventor: Keiji Mabuchi, Kanagawa (JP)

(73) Assignee: Sony Corporation, Tokyo (JP)

( * ) Notice: Subject to any disclaimer, the term of this patent is extended or adjusted under 35 U.S.C. 154(b) by 468 days.

(21) Appl. No.: 13/071,707

(22) Filed: Mar. 25, 2011

(65) Prior Publication Data

US 2011/0242378 A1 Oct. 6, 2011

(30) Foreign Application Priority Data

Apr. 2, 2010 (JP) ................................. 2010-085981

(51) Int. Cl.
| | |
|---|---|
| H04N 3/14 | (2006.01) |
| H04N 5/335 | (2011.01) |
| H04N 5/3745 | (2011.01) |
| H01L 27/146 | (2006.01) |
| H04N 5/355 | (2011.01) |
| H04N 5/353 | (2011.01) |

(52) U.S. Cl.
CPC ........ *H01L 27/14609* (2013.01); *H04N 5/3745* (2013.01); *H04N 5/35581* (2013.01); *H04N 5/353* (2013.01); *H01L 27/14643* (2013.01)
USPC ........... 348/296; 348/308; 257/223; 257/229; 257/292; 250/208.1

(58) Field of Classification Search
USPC .......... 348/296, 308; 257/223, 229, 292, 448; 250/208.1
See application file for complete search history.

(56) References Cited

U.S. PATENT DOCUMENTS

| | | | |
|---|---|---|---|
| 2010/0013972 A1* | 1/2010 | Adkisson et al. | 348/308 |
| 2010/0187401 A1 | 7/2010 | Kawahito | |
| 2010/0231771 A1* | 9/2010 | Yaghmai | 348/308 |

FOREIGN PATENT DOCUMENTS

| | | |
|---|---|---|
| JP | HEI 10-322599 | 12/1998 |
| JP | 2000-023044 | 1/2000 |
| JP | 2004-282552 | 10/2004 |
| JP | 2007-083704 | 4/2007 |
| JP | 2009-049870 | 3/2009 |
| JP | 2009-296574 | 12/2009 |

* cited by examiner

*Primary Examiner* — Paul Berardesca
(74) *Attorney, Agent, or Firm* — Dentons US LLP

(57) ABSTRACT

A solid-state imaging device with unit pixels which have a photoelectric conversion element, an electric charge transferring/accumulating unit with multiple levels able to transfer electric charge generated in the photoelectric conversion element and accumulate the electric charge, and an electric charge detection unit that holds the electric charge transferred from the photoelectric conversion element, where, after resetting the photoelectric conversion element, all unit pixels simultaneously transfer signal electric charges, which are generated in the photoelectric conversion element during continuous exposure times of which each has a different duration, to the electric charge transferring/accumulating units and accumulate the signal electric charges in the different respective electric charge transferring/accumulating units, and in units of one or more pixels, the signal electric charges is transferred to the electric charge detecting unit and a plurality of signals which respectively corresponds to the plurality of signal electric charges is read out.

5 Claims, 11 Drawing Sheets

US 8,902,341 B2

SOLID-STATE IMAGING DEVICE, DRIVING METHOD OF SOLID-STATE IMAGING DEVICE, AND ELECTRONIC APPARATUS

BACKGROUND OF THE INVENTION

1. Field of the Invention

The present invention relates to a solid-state imaging device, a driving method of the solid-state imaging device, and an electronic apparatus, and in particular, to a solid-state imaging device corresponding to a global shutter, a driving method of the solid-state imaging device, and an electronic apparatus.

2. Description of the Related Art

In the related art, it has been proposed that a dynamic range of a solid-state imaging device may be expanded by providing two potential wells with regard to one photodiode (for example, refer to International Publication No. WO2007-83704). Specifically, a potential well is provided on both sides of a photodiode so that there is a difference in an inflowing amount of electric charge with regard to light of the same intensity. Thus, it has been proposed that the electric charge that is accumulated in the potential well where the inflow amount is larger is read out as a high-sensitivity signal, the electric charge which is accumulated in the potential well where the inflow amount is smaller is read out as a low-sensitivity signal, and that the dynamic range of the solid-state imaging device is expanded by using these two signals.

Further, in the related art, an all-pixel simultaneous electronic shutter for a CMOS high-speed image sensor has been developed. The all-pixel simultaneous electronic shutter simultaneously starts exposure of all pixels that are valid for imaging and performs an operation to simultaneously end the exposure, and is also referred to as a global shutter (global exposure).

Still further, in the related art, it has been proposed that moving image imaging using a global shutter is possible by providing two electric charge holding units in a pixel (for example, refer to Japanese Publication No. JP 2009-296574). Specifically, two electric charge holding units of a first electric charge holding unit and a second electric charge holding unit are provided between a photodiode and a floating diffusion region (FD region). Then, an electric charge accumulated in a previous frame is held in the second electric charge holding unit, is transferred to the FD area for every line, and a pixel signal is read out based on the electric charge of the previous frame. At the same time, the photodiode is reset to be simultaneous for all pixels and exposure is started, and the electric charge that is accumulated in the photodiode is transferred simultaneously to the first electric charge holding unit for all of the pixels. According to this, moving image imaging using a global shutter becomes possible.

SUMMARY OF THE INVENTION

However, according to the invention described in International Publication No. WO2007-83704, two floating diffusion areas are provided for one pixel. As a result, the area of the photodiode become smaller for each pixel and sensitivity is lowered. Conversely, unless the area of the photodiode for each pixel is made smaller, the area for each pixel becomes large and the size of the solid-state imaging device becomes large.

Further, according to the invention described by International Publication No. WO2007-83704, electric charges are transferred to two potential wells provided in different directions from the one photodiode. However, it is difficult to form a distribution of impurities in the photodiode so that it is possible to completely transfer electric charges in different directions from the one photodiode. As a result, according to the invention described by International Publication No. WO2007-83704, there are cases where the electric charge accumulated in the photodiode remains without being completely transferred, or where there is variation between pixels in characteristics of an electric charge transfer amount to the two potential wells. As a result, there is noise, variation in pixel characteristics, and the like, and deterioration in image quality is caused.

Further, according to the invention of International Publication No. WO2007-83704, since performing of a global shutter is not possible and a so-called rolling shutter is performed, there is a discrepancy in an exposure time for each line, and in particular, a fast-moving subject is imaged in a distorted manner.

Also, according to the invention described in Japanese Publication No. JP 2009-296574, other than the electric charge holding unit, an electric charge discharge unit is provided which discharges unnecessary electric charge accumulated in the photodiode. However, as described above, it is technically difficult to completely transfer electric charges in different directions from the one photodiode. As a result, due to the reasons described above, there is noise, variation in pixel characteristics, and the like, and deterioration in image quality is caused.

It is desirable to be able to improve the image quality of an image imaged using a global shutter. More specifically, it is desirable to expand the dynamic range without lowering the image quality of an image imaged using a global shutter. Further, it is desirable to be able to improve the image quality of moving image imaging using a global shutter.

According to a solid-state imaging device of a first embodiment of the invention, a plurality of unit pixels, which is provided with a photoelectric conversion element, a photoelectric transferring and accumulating unit with multiple levels that is able to transfer an electric charge that is generated in the photoelectric conversion element in order and accumulate the electric charge, and an electric charge detection unit that holds the electric charge transferred from the photoelectric conversion element via the electric charge transferring and accumulating unit with multiple levels so as to be read out as signals, are arranged two-dimensionally; where, after resetting the photoelectric conversion element, all of the plurality of unit pixels simultaneously transfer a plurality of signal electric charges, which is generated in the photoelectric conversion element during a plurality of continuous exposure times of which each has a different duration, in order to the electric charge transferring and accumulating units and accumulate the plurality of signal electric charges in the different respective electric charge transferring and accumulating units, and in pixel units of one or a plurality of pixels, the plurality of signal electric charges is transferred to the electric charge detecting unit in the order of being transferred to the electric charge transferring and accumulating unit and a plurality of signals which respectively corresponds to the plurality of signal electric charges is read out.

In the plurality of continuous exposure times, it is possible for the later exposure times to have shorter durations.

Unnecessary electric charges accumulated in the photoelectric conversion element are able to be discharged to the electric charge transferring and accumulating unit when the photoelectric conversion element is reset before the start of the plurality of continuous exposure times.

According to a driving method of a solid-state imaging device of the first embodiment of the invention, in a solid-state imaging device with a plurality of unit pixels, which is provided with a photoelectric conversion element, a photoelectric transferring and accumulating unit with multiple levels that is able to transfer an electric charge that is generated in the photoelectric conversion element in order and accumulate the electric charge, and an electric charge detection unit that holds the electric charge transferred from the photoelectric conversion element via the electric charge transferring and accumulating unit with multiple levels so as to be read out as signals, are arranged two-dimensionally, after resetting the photoelectric conversion element, all of the plurality of unit pixels simultaneously perform transferring of a plurality of electric charges, which is generated in the photoelectric conversion element during a plurality of continuous exposure times of which each has a different duration, in order to the electric charge transferring and accumulating units and accumulating of the plurality of electric charges in the different respective electric charge transferring and accumulating units, and in pixel units of one or a plurality of pixels, driving so as to transfer the plurality of electric charges to the electric charge detecting unit in the order of being transferred to the electric charge transferring and accumulating units and read out a plurality of signals which respectively corresponds to the plurality of signal electric charges.

In the plurality of continuous exposure times, it is possible for the later exposure times to have shorter durations.

Unnecessary electric charge accumulated in the photoelectric conversion element is able to be discharged to the electric charge transferring and accumulating unit when the photoelectric conversion element is reset before the start of the plurality of continuous exposure times.

According to an electronic apparatus of the first embodiment of the invention, there is mounted a solid-state imaging device with a plurality of unit pixels, which is provided with a photoelectric conversion element, a photoelectric transferring and accumulating unit with multiple levels that is able to transfer an electric charge that is generated in the photoelectric conversion element in order and accumulate the electric charge, and an electric charge detection unit that holds the electric charge transferred from the photoelectric conversion element via the electric charge transferring and accumulating unit with multiple levels so as to be read out as signals, are arranged two-dimensionally, where, after resetting the photoelectric conversion element, all of the plurality of unit pixels simultaneously transfer a plurality of signal electric charges, which is generated in the photoelectric conversion element during a plurality of continuous exposure times of which each has a different duration, in order to the electric charge transferring and accumulating units and accumulate the plurality of signal electric charges in the different respective electric charge transferring and accumulating units, and in pixel units of one or a plurality of pixels, the plurality of signal electric charges is transferred to the electric charge detecting unit in the order of being transferred to the electric charge transferring and accumulating unit and a plurality of signals which respectively corresponds to the plurality of signal electric charges is read out.

According to the first embodiment of the invention, after resetting the photoelectric conversion element, all of the plurality of unit pixels of the solid-state imaging device simultaneously transfer a plurality of electric charges, which is generated in the photoelectric conversion element during a plurality of continuous exposure times of which each has a different duration, in order to the electric charge transferring and accumulating units and accumulate the plurality of electric charges in the different respective electric charge transferring and accumulating units, and in pixel units of one or a plurality of pixels, the plurality of electric charges is transferred to the electric charge detecting unit in the order of being transferred to the electric charge transferring and accumulating unit and a plurality of signals which respectively corresponds to the plurality of signal electric charges is read out.

According to a solid-state imaging device of a second embodiment of the invention, a plurality of unit pixels, which is provided with a photoelectric conversion element, a photoelectric transferring and accumulating unit with multiple levels that is able to transfer an electric charge that is generated in the photoelectric conversion element in order and accumulate the electric charge, and an electric charge detection unit that holds the electric charge transferred from the photoelectric conversion element via the electric charge transferring and accumulating unit with multiple levels so as to be read out as signals, are arranged two-dimensionally; where, after an accumulation start process of transferring unnecessary electric charge accumulated in the photoelectric conversion element to the photoelectric transferring and accumulating unit, all of the plurality of unit pixels simultaneously executes an accumulation completion process of transferring the signal electric charge generated in the photoelectric conversion element in a predetermined exposure time to the electric charge transferring and accumulating unit after the unnecessary electric charge has been transferred, and executes a reading out process of transferring the signal electric charge to the electric charge detecting unit in pixel units of one or a plurality of pixels and reading out signals which respectively corresponds to the signal electric charge, where the accumulation start process of transferring the unnecessary electric charge accumulated in the photoelectric conversion element to the photoelectric transferring and accumulating unit, is performed during execution of the reading out process.

It is possible for the unnecessary electric charge to be transferred to the electric charge detection unit and be discharged from the electric charge detection unit.

Immediately after the signal electric charge is transferred to the electric charge transferring and accumulating unit, it is possible for the reading out process to begin.

According to a driving method of a solid-state imaging device of the second embodiment of the invention, in a solid-state imaging device with a plurality of unit pixels, which is provided with a photoelectric conversion element, a photoelectric transferring and accumulating unit with multiple levels that is able to transfer the electric charge that is generated in the photoelectric conversion element in order and accumulate the electric charge, and an electric charge detection unit that holds the electric charge transferred from the photoelectric conversion element via the electric charge transferring and accumulating unit with multiple levels so as to be read out as signals, are arranged two-dimensionally, after an accumulation start process of transferring the unnecessary electric charge accumulated in the photoelectric conversion element to the photoelectric transferring and accumulating unit, all of the plurality of unit pixels simultaneously perform executing of an accumulation completion process of transferring the signal electric charge generated in the photoelectric conversion element in a predetermined exposure time to the electric charge transferring and accumulating unit after the unnecessary electric charge has been transferred, and executing of a reading out process of transferring the signal electric charge to the electric charge detecting unit in pixel units of one or a plurality of pixels and reading out signals which respectively correspond to the signal electric charge, where the accumulation start process of transferring the unnecessary electric charge accumulated in the photoelectric conversion element to the photoelectric transferring and accumulating unit, is performed during execution of the reading out process.

It is possible for the unnecessary electric charge to be transferred to the electric charge detection unit and be discharged from the electric charge detection unit.

Immediately after the signal electric charge is transferred to the electric charge transferring and accumulating unit, it is possible for the reading out process to begin.

According to an electronic apparatus of the second embodiment of the invention, there is mounted a solid-state imaging device with a plurality of unit pixels, which is provided with a photoelectric conversion element, a photoelectric transferring and accumulating unit with multiple levels that is able to transfer the electric charge that is generated in the photoelectric conversion element in order and accumulate the electric charge, and an electric charge detection unit that holds the electric charge transferred from the photoelectric conversion element via the electric charge transferring and accumulating unit with multiple levels so as to be read out as signals, are arranged two-dimensionally; where, after an accumulation start process of transferring the unnecessary electric charge accumulated in the photoelectric conversion element to the photoelectric transferring and accumulating unit, all of the plurality of unit pixels simultaneously executes an accumulation completion process of transferring the signal electric charge generated in the photoelectric conversion element in a predetermined exposure time to the electric charge transferring and accumulating unit after the unnecessary electric charge has been transferred, and executes a reading out process of transferring the signal electric charge to the electric charge detection unit in pixel units of one or a plurality of pixels and reading out signals which respectively correspond to the signal electric charge, where the accumulation start process of transferring the unnecessary electric charge accumulated in the photoelectric conversion element to the photoelectric transferring and accumulating unit, is performed during execution of the reading out process.

According to the second embodiment of the invention, after an accumulation start process of transferring the unnecessary electric charge accumulated in the photoelectric conversion element to the photoelectric transferring and accumulating unit, all of the plurality of unit pixels simultaneously executes an accumulation completion process of transferring the signal electric charge generated in the photoelectric conversion element in a predetermined exposure time to the electric charge transferring and accumulating unit after the unnecessary electric charge has been transferred, and executes a reading out process of transferring the signal electric charge to the electric charge detection unit in pixel units of one or a plurality of pixels and reading out signals which respectively correspond to the signal electric charge, where the accumulation start process of transferring the unnecessary electric charge accumulated in the photoelectric conversion element to the photoelectric transferring and accumulating unit, is performed during execution of the reading out process.

According to a solid-state imaging device of a third embodiment of the invention, a plurality of unit pixels, which is provided with a photoelectric conversion element, a photoelectric transferring and accumulating unit with multiple levels that is able to transfer the electric charge that is generated in the photoelectric conversion element in order and accumulate the electric charge, and an electric charge detection unit that holds the electric charge transferred from the photoelectric conversion element via the electric charge transferring and accumulating unit with multiple levels so as to be read out as signals, are arranged two-dimensionally; where, all of the plurality of unit pixels simultaneously starts accumulation of the signal electric charge of the photoelectric conversion element by transferring the unnecessary electric charge accumulated in the photoelectric conversion element to the photoelectric transferring and accumulating unit, and in pixel units of one or a plurality of pixels, transfers the unnecessary electric charge transferred to the photoelectric transferring and accumulating unit to the electric charge detecting unit and discharges from the electric charge detecting unit.

According to a driving method of a solid-state imaging device of the third embodiment of the invention, in a solid-state imaging device with a plurality of unit pixels, which is provided with a photoelectric conversion element, a photoelectric transferring and accumulating unit with multiple levels that is able to transfer the electric charge that is generated in the photoelectric conversion element in order and accumulate the electric charge, and an electric charge detection unit that holds the electric charge transferred from the photoelectric conversion element via the electric charge transferring and accumulating unit with multiple levels so as to be read out as signals, are arranged two-dimensionally, all of the plurality of unit pixels simultaneously perform starting of the accumulation of the signal electric charge of the photoelectric conversion element by transferring the unnecessary electric charge accumulated in the photoelectric conversion element to the photoelectric transferring and accumulating unit, and in pixel units of one or a plurality of pixels, transferring of the unnecessary electric charge transferred to the photoelectric transferring and accumulating unit to the electric charge detecting unit and discharging the unnecessary electric charge from the electric charge detecting unit.

According to an electronic apparatus of the third embodiment of the invention, there is mounted a solid-state imaging device with a plurality of unit pixels, which is provided with a photoelectric conversion element, a photoelectric transferring and accumulating unit with multiple levels that is able to transfer the electric charge that is generated in the photoelectric conversion element in order and accumulate the electric charge, and an electric charge detection unit that holds the electric charge transferred from the photoelectric conversion element via the electric charge transferring and accumulating unit with multiple levels so as to be read out as signals, are arranged two-dimensionally; where, all of the plurality of unit pixels simultaneously starts accumulation of the signal electric charge of the photoelectric conversion element by transferring the unnecessary electric charge accumulated in the photoelectric conversion element to the photoelectric transferring and accumulating unit, transfers the unnecessary electric charge transferred to the photoelectric transferring and accumulating unit to the electric charge detecting unit in pixel units of one or a plurality of pixels, and discharges from the electric charge detecting unit.

According to the third embodiment of the invention, all of the plurality of unit pixels simultaneously starts accumulation of the signal electric charge of the photoelectric conversion element by transferring the unnecessary electric charge accumulated in the photoelectric conversion element to the photoelectric transferring and accumulating unit, transfers the unnecessary electric charge transferred to the photoelectric transferring and accumulating unit to the electric charge detecting unit in pixel units of one or a plurality of pixels, and discharges from the electric charge detecting unit.

According to the first to third embodiments, the image quality of an image imaged using a global shutter is improved. In particular, according to the first embodiment of the invention, it is possible to expand dynamic range without lowering the image quality of an image imaged using the global shutter. Additionally, according to the second embodiment of the invention, the image quality of moving image imaging using a global shutter is improved. Furthermore, according to the third embodiment of the invention, it is possible to reliably discharge unnecessary electric charge and the image quality of an image imaged using a global shutter is improved.

DESCRIPTION OF THE PREFERRED EMBODIMENTS

Below, embodiments for realizing the invention (referred to below as embodiments) will be described. Here, the description will be performed in the order below.
1. Embodiments
2. Modified Examples 1. Embodiments First, a first embodiment of the invention will be described with reference to FIGS. 1 to 7.

Configuration Example of Solid-State Imaging Device

Figure 1:
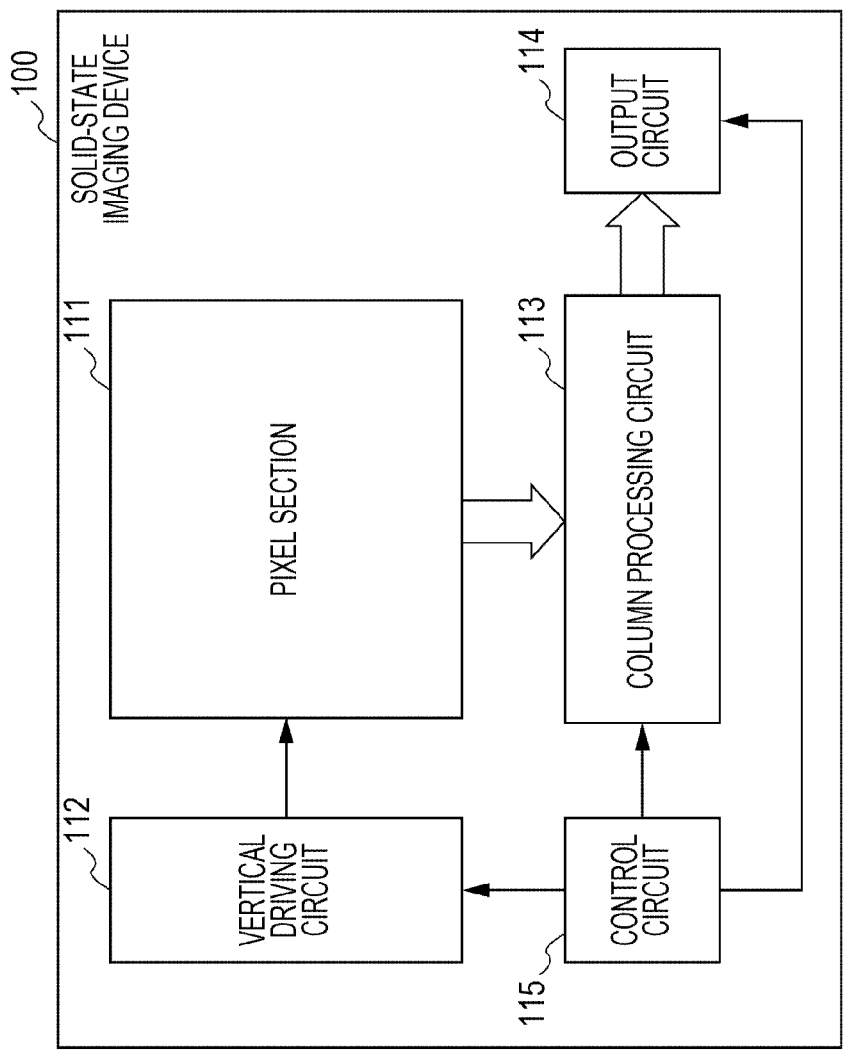
FIG. 1 is a block diagram illustrating a configuration example of a solid-state imaging device according to an embodiment of the invention.

FIG. 1 is a block diagram illustrating a configuration example of a solid-state imaging device according to an embodiment of the invention.

A solid-state imaging device 100 is configured to include a pixel section 111, a vertical driving circuit 112, a column processing circuit 113, an output circuit 114, and a control circuit 115. The pixel section 111, the vertical driving circuit 112, the column processing circuit 113, the output circuit 114, and the control circuit 115 are formed on a semiconductor substrate (chip) which is not shown.

In the pixel section 111, the pixel units (the pixel units 131 of FIGS. 2 and 3), which have a photoelectric conversion element which generates and internally accumulates photoelectric charge with an electric charge amount corresponding to an amount of incident light, are arranged two-dimensionally in rows and columns. Here, below, there are cases where the photoelectric charge with the electric charge amount corresponding to the amount of incident light is simply referred to as "electric charge" and the unit pixels are simply referred to as "pixels". Furthermore, although not shown, in the pixel section 111, with regard to the pixel arrangement in the row and column formation, pixel driving lines are formed for each row along the left/right direction of the diagram (arrangement direction of the pixels in the pixel rows) and vertical signal lines are formed for each column along the up/down direction of the diagram (arrangement direction of the pixels in the pixel columns).

The vertical driving circuit 112 is configured by a shift register or an address decoder which selects one row or all of the rows of the pixel rows according to conditions, a switching circuit which passes driving pulses to selected pixel rows, a buffer circuit which buffers this and drives the pixel driving lines, and the like, and is a pixel driving section which drives each unit pixel of the pixel section 111 in pixel units, in units of rows, or all pixels simultaneously.

The pixel signals output from each unit pixel of a pixel row, which are selected and scanned by the vertical driving circuit 112, are supplied to the column processing circuit 113 via the vertical signal lines (not shown). The column processing circuit 113 performs predetermined signal processing with regard to the pixel signals and temporarily holds the pixel signals of the after signal processing.

Specifically, the column processing circuit 113 performs noise removal processing, such as CDS processing (Correlated Double Sampling) as the signal processing. For example, by performing CDS processing, random noise which is specific to pixels such as reset noise or threshold variation in the amplifying transistor and fixed pattern noise is removed. In addition, other than noise removal processing, it is also possible for the column processing circuit 113 to, for example, have an AD (analog-digital) conversion function and output a signal level as a digital signal.

Additionally, the column processing circuit 113 is provided with a horizontal driving section configured by a shift register, an address decoder, or the like, and using selection and scanning by the horizontal driving section, the pixel signals which have been signal processed by the column processing circuit 113 are output in order to the output circuit 114.

The output circuit 114 performs various forms of signal processing such as gain adjustment, damage correction, addition processing, and the like with regard to the pixel signals output from the column processing circuit 113. The output circuit 114 outputs the pixel signals which are pixel signals after signal processing has been performed to an external portion of the solid-state imaging device 100. In addition, the output circuit 114 may be realized by processing using an external signal processing section provided on a different substrate to the solid-state imaging device 100 such as a DSP (Digital Signal Processor) or software, and may be mounted on the same substrate as the solid-state imaging device 100.

The control circuit 115 is configured by a timing generator or the like which generates various timing signals, and performs driving control of the vertical driving section 112, the column processing circuit 113, the output circuit 114, and the like based on the various timing signals generated by the timing generator.

Configuration of Unit Pixel

Next, a specific configuration of a unit pixel 131 arranged in a row and column formation in the pixel section 111 of FIG. 1 will be described with reference to FIGS. 2 and 3.

Figure 2:
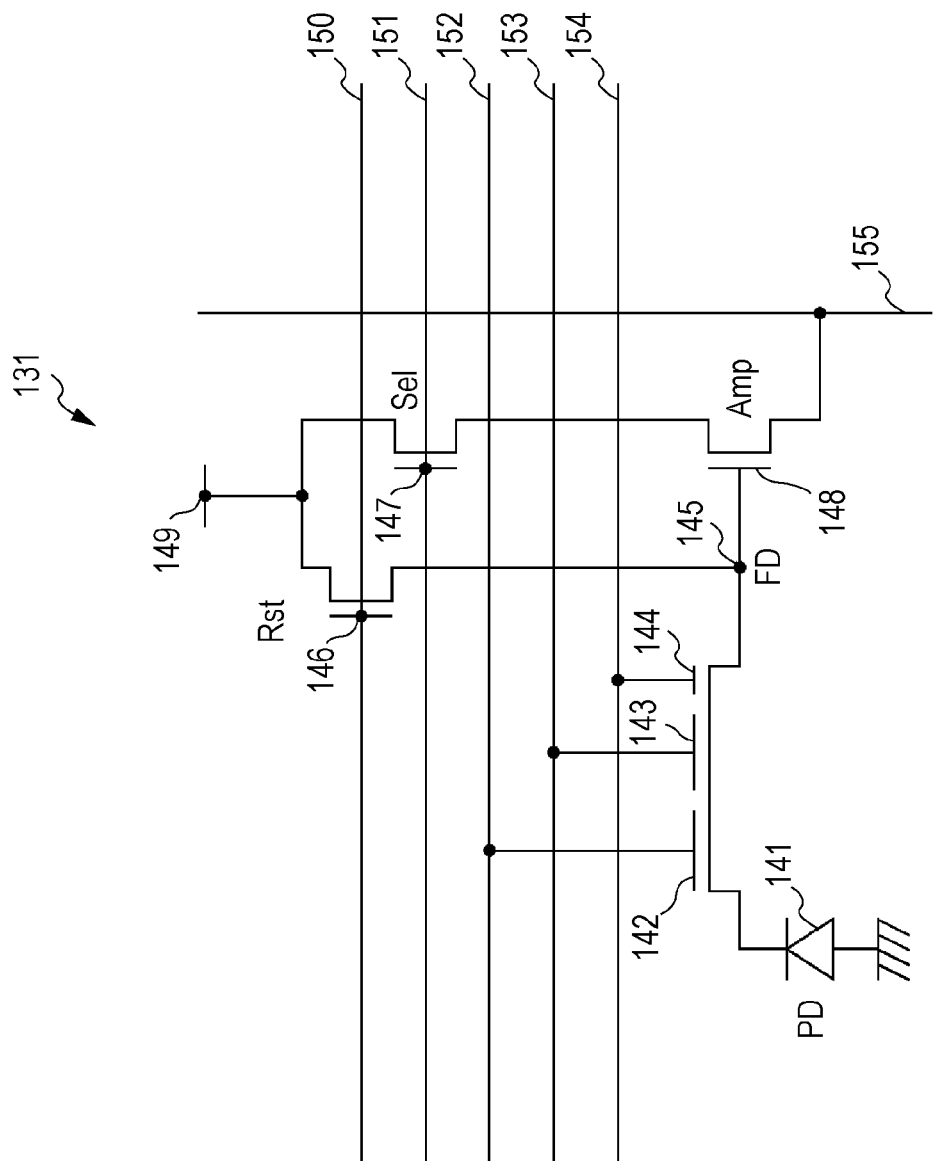
FIG. 2 is a circuit diagram illustrating an example of a circuit configuration of a unit pixel.

FIG. 2 shows an example of a circuit configuration of the unit pixel 131. The unit pixel 131 is configured to include a photodiode (PD) 141 which is a photoelectric conversion element, a first CCD 142, a second CCD 143, a transfer gate 144, a floating diffusion (FD) region 145, a reset transistor (Rst) 146, a selection transistor (Sel) 147, an amplification transistor (Amp) 148 and a power source 149.

The anode of the photodiode 141 is grounded and the cathode is connected to the floating diffusion region 145 via the first CCD 142, the second CCD 143, and the transfer gate 144.

A gate electrode 171A (FIG. 3) of the first CCD 142 is connected to a CCD1 line 152. The CCD1 line 152 is provided for each row and the gate electrodes 171A of the first CCDs 142 of the same row of the unit pixels 131 are connected to the same CCD1 line 152.

A gate electrode 173A (FIG. 3) of the second CCD 143 is connected to a CCD2 line 153. The CCD2 line 153 is provided for each row and the gate electrodes 173A of the second CCDs 143 of the same row of the unit pixels 131 are connected to the same CCD2 line 153.

A gate electrode 144A (FIG. 3) of the transfer gate 144 is connected to a transfer line 154. The transfer line 154 is provided for each row and the gate electrodes 144A of the transfer gates 144 of the same row of the unit pixels 131 are connected to the same transfer line 154.

The reset transistor 146 is configured by, for example, an N-channel MOS transistor. The drain electrode of the reset transistor 146 is connected to the power source 149, the gate electrode of the reset transistor 146 is connected to a Rst line 150, and the source electrode of the reset transistor 146 is connected to the floating diffusion region 145. The Rst line 150 is provided for each row and the gate electrodes of the reset transistor 146 of the unit pixels 131 are connected to the same Rst line 150. Additionally, a reset pulse RST is applied to the gate electrodes of the reset transistor 146, and by turning the reset transistor 146 on, the floating diffusion region 145 is reset and electric charge is discharged from the floating diffusion region 145.

The selection transistor 147 is configured by, for example, an N-channel MOS transistor. The drain electrode of the selection transistor 147 is connected to the power source 149, the gate electrode of the selection transistor 147 is connected to a SEL line 151, and the source electrode of the selection transistor 147 is connected to the drain of the amplification transistor 148. The SEL line 151 is provided for each row and the gate electrodes of the selection transistor 147 of the same row of the unit pixels 131 are connected to the same SEL line 151. Additionally, a selection pulse SEL is applied to the gate electrodes of the selection transistor 147, and by turning the selection transistor 147 on, the unit pixel 131, which is the target for reading out of the pixel signals, is selected.

The amplification transistor 148 is configured by, for example, an N-channel MOS transistor. The gate electrode of the amplification transistor 148 is connected to the floating diffusion region 145 and the source electrode of the amplification transistor 148 is connected to a vertical signal line 155. The vertical signal line 155 is provided for each row and the source electrodes of the amplification transistor 148 of the same row of the unit pixels 131 are connected to the same vertical signal line 155. When the selection transistor 147 is on, the amplification transistor 148 supplies a signal showing the voltage of the floating diffusion region 145 to the column processing circuit 113 via the vertical signal line 155.

In addition, the combination of the conductivity types of the reset transistor 146, the amplification transistor 148, and the selection transistor 147 are only one example and is not limited to this combination. In addition, it is possible for one or a plurality of the reset transistor 146, the amplification transistor 148, and the selection transistor 147 to be omitted or shared between a plurality of pixels depending on the readout out method of the pixel signals. Furthermore, for example, it is also possible to position the selection transistor 147 between the amplification transistor 148 and the vertical signal line 155.

Figure 3:
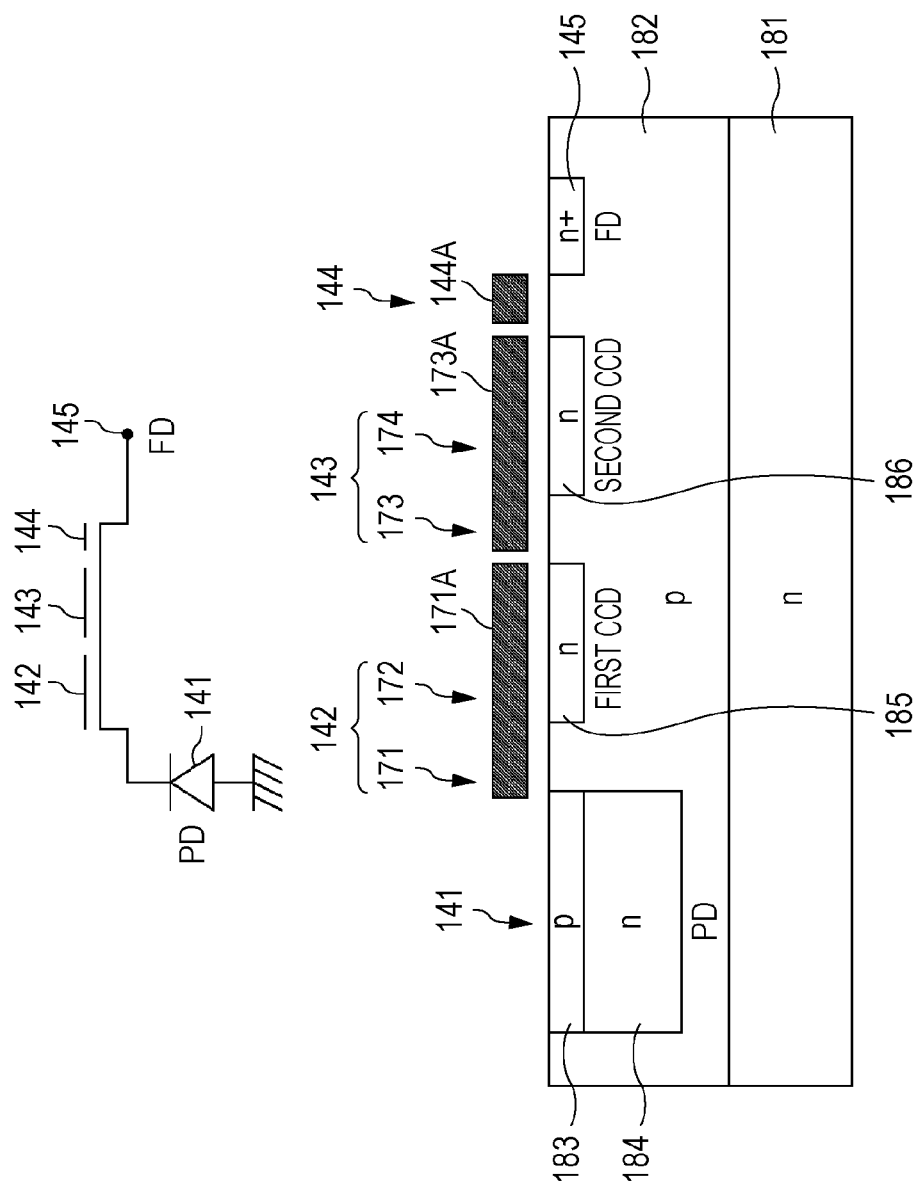
FIG. 3 is a diagram illustrating a configuration example of the unit pixel.

FIG. 3 schematically shows a cross-sectional configuration of the unit pixel 131 from the photodiode 141 to the floating diffusion region 145.

The photodiode 141 is, for example, an embedded-type photodiode which is formed by forming a P-type layer 183 on the substrate surface side and embedding an N-type embedded layer 184 with regard to a P-type well layer 182 formed on a N-type substrate 181. In addition, the P-type well layer 182 is thinly formed between the N-type embedded layer 184 and the N-type substrate 181. According to this, in a case when the photodiode 141 is saturated, electric current which overflows from the photodiode 141 is discharged to the N-type substrate 181 via the thin P-type well layer 182 without flowing to the first CCD 142.

The first CCD 142 is configured by a first CCD gate 171 and a memory section 172. When a transfer pulse TRC1 is applied to the gate electrode 171A, the first CCD gate 171 transfers electric charge accumulated in the photodiode 141. In addition, below, a state where the transfer pulse TRC1 is applied to the gate electrode 171A is referred to as a state where the transfer pulse TRC1 is on or a state where the first CCD gate 171 is on. Furthermore, below, a state where the transfer pulse TRC1 is not applied to the gate electrode 171A is referred to as a state where the transfer pulse TRC1 is off or a state where the first CCD gate 171 is off.

The memory section 172 is formed by an N-type embedded channel 185 with a low density formed under the gate electrode 171A and accumulates electric charge transferred from the photodiode 141 using the first CCD gate 171. In addition, by the memory section 172 being formed by the N-type embedded channel 185 and the off voltage of the gate electrode 171A being set as a negative voltage with regard to the P-type well layer 182, it is possible to suppress generation of a dark current at the Si—SiO$_2$ boundary and it is possible to improve image quality.

In addition, the gate electrode 171A is arranged on an upper portion of the memory section 172, and by applying the transfer pulse TRC1 to the gate electrode 171A, it is possible to apply modulation to the memory section 172. That is, by applying the transfer pulse TRC1 to the gate electrode 171A, the potential of the memory section 172 is deepened. According to this, it is possible to increase the amount of saturated electric charge of the memory section 172 more than in a case where modulation is not applied.

The second CCD 143 is configured by a second CCD gate 173 and a memory section 174. When a transfer pulse TRC2 is applied to the gate electrode 173A, the second CCD gate 173 transfers electric charge accumulated in the memory section 172. In addition, below, a state where the transfer pulse TRC2 is applied to the gate electrode 173A is referred to as a state where the transfer pulse TRC2 is on or a state where the second CCD gate 173 is on. Furthermore, below, a state where the transfer pulse TRC2 is not applied to the gate electrode 173A is referred to as a state where the transfer pulse TRC2 is off or a state where the second CCD gate 173 is off.

The memory section 174 is formed by an N-type embedded channel 186 with a low density formed under the gate electrode 173A and accumulates the electric charge transferred from the memory section 172 using the second CCD gate 173. In addition, by the memory section 174 being formed by the N-type embedded channel 186 and the off voltage of the gate electrode 173A being set as a negative voltage with regard to the P-type well layer 182, it is possible to suppress generation of a dark current at the Si—$SiO_2$ boundary and it is possible to improve image quality.

In addition, the gate electrode 173A is arranged on an upper portion of the memory section 174, and by applying the transfer pulse TRC2 to the gate electrode 173A, it is possible to apply modulation to the memory section 174. That is, by applying the transfer pulse TRC2 to the gate electrode 173A, the potential of the memory section 174 is deepened. According to this, it is possible to increase the amount of saturated electric charge of the memory section 174 more than in a case where modulation is not applied.

In this manner, in the unit pixel 131, electric charge generated by the photodiode 141 is transferred in order and two levels of CCDs, which are able to accumulate electric charge, are provided.

When a transfer pulse TRG is applied to the gate electrode 144A, the transfer gate 144 transfers the electric charge accumulated in the memory section 174. In addition, below, a state where the transfer pulse TRG is applied to the gate electrode 144A is referred to as a state where the transfer pulse TRG is on or a state where the transfer gate 144 is on. Furthermore, below, a state where the transfer pulse TRG is not applied to the gate electrode 144A is referred to as a state where the transfer pulse TRG is off or a state where the transfer gate 144 is off.

The floating diffusion region 145 is an electric charge voltage conversion section formed from an N-type layer, holds the electric charge transferred from the memory section 174 by the transfer gate 144 to be read out as a signal, and converts the held electric charge to a voltage.

In addition, the memory section 172, the memory section 174, and the surface of the floating diffusion region 145 block light.

First Embodiment of Driving Method of Unit Pixel 131

Figure 4:
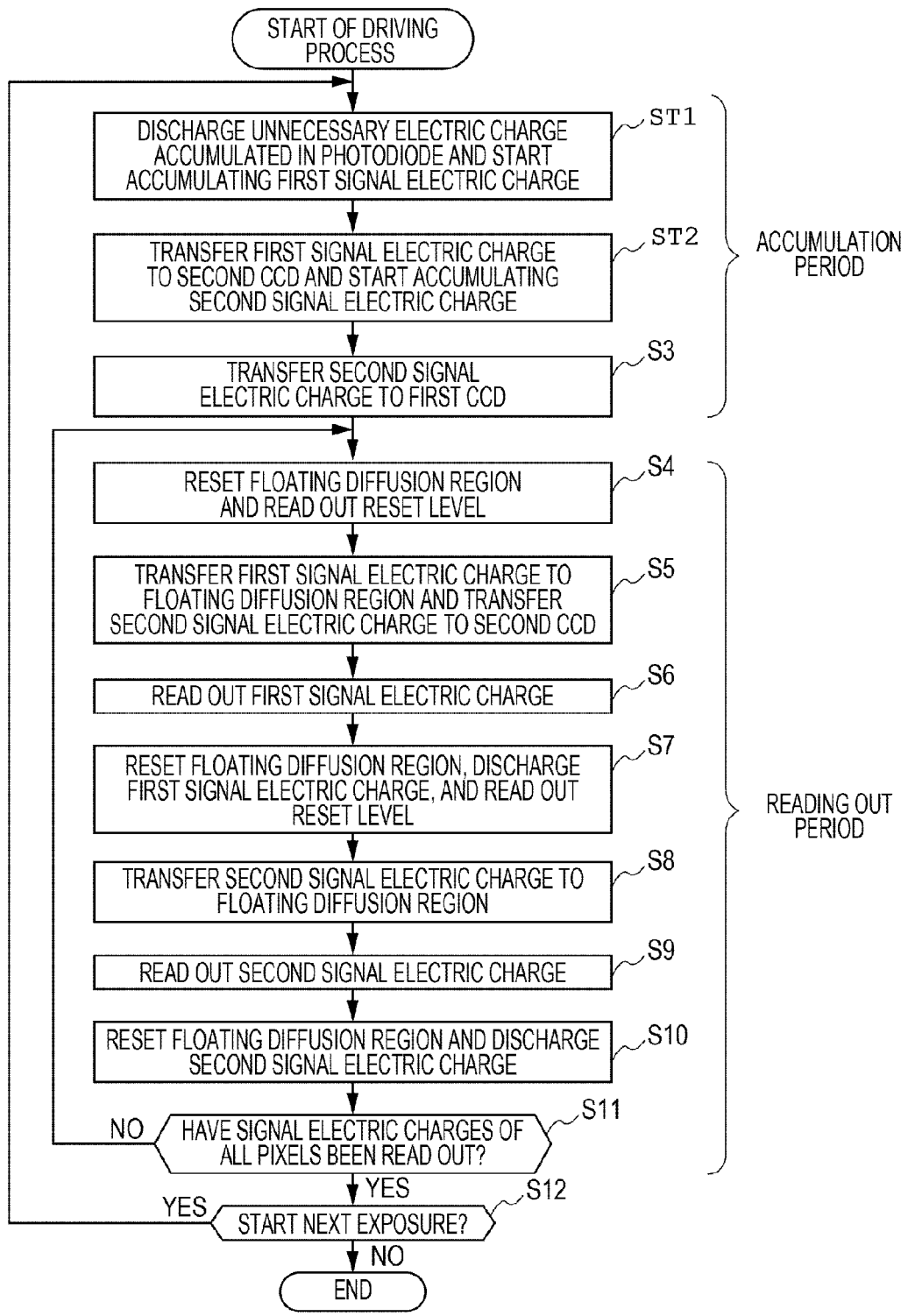
FIG. 4 is a flow chart for describing a driving process of a solid-state imaging device according to a first embodiment.
Figure 5:
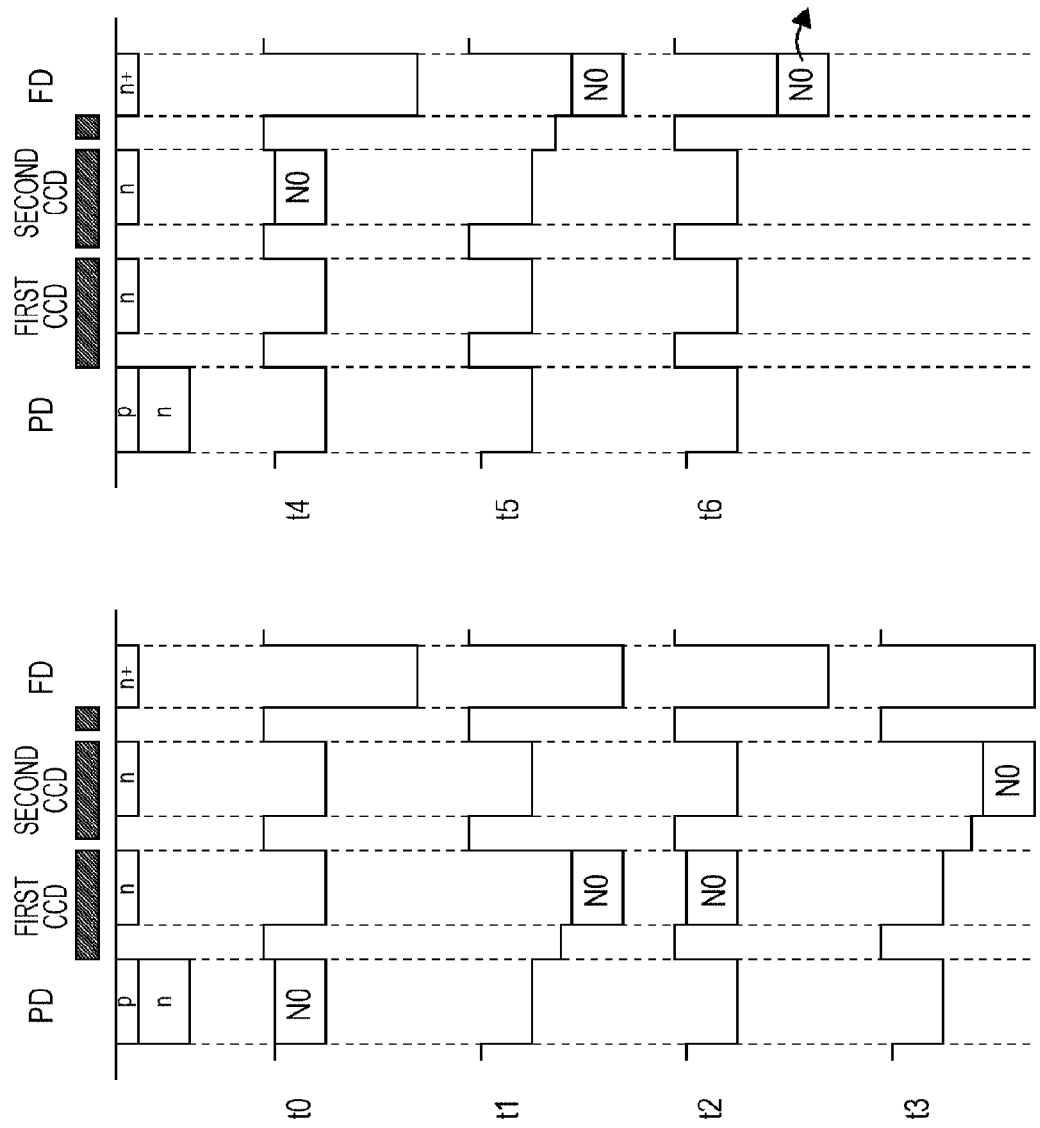
FIG. 5 is a potential diagram for describing the driving process of the solid-state imaging device according to the first embodiment.
Figure 6:
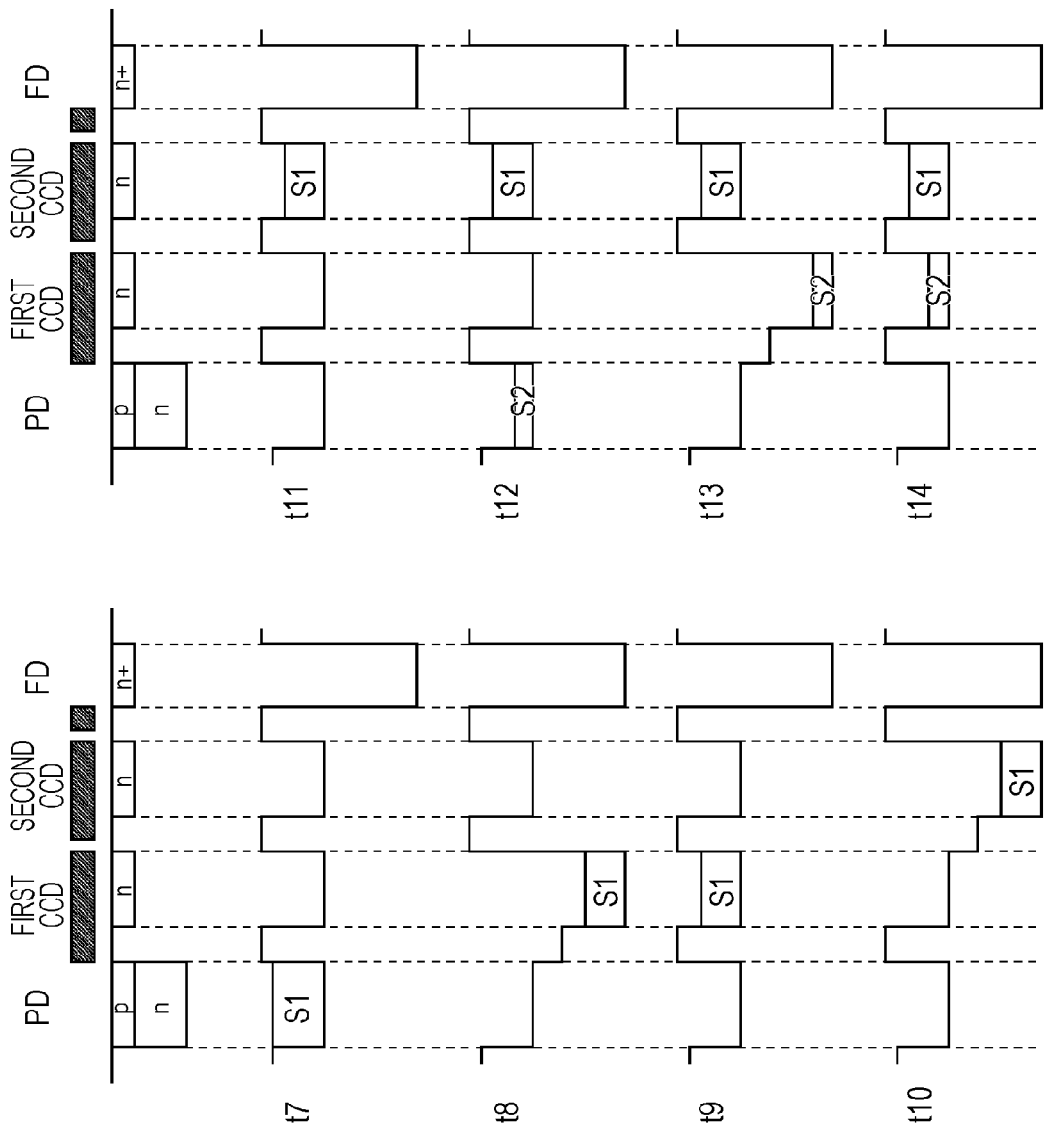
FIG. 6 is a potential diagram for describing the driving process of the solid-state imaging device according to the first embodiment.
Figure 7:
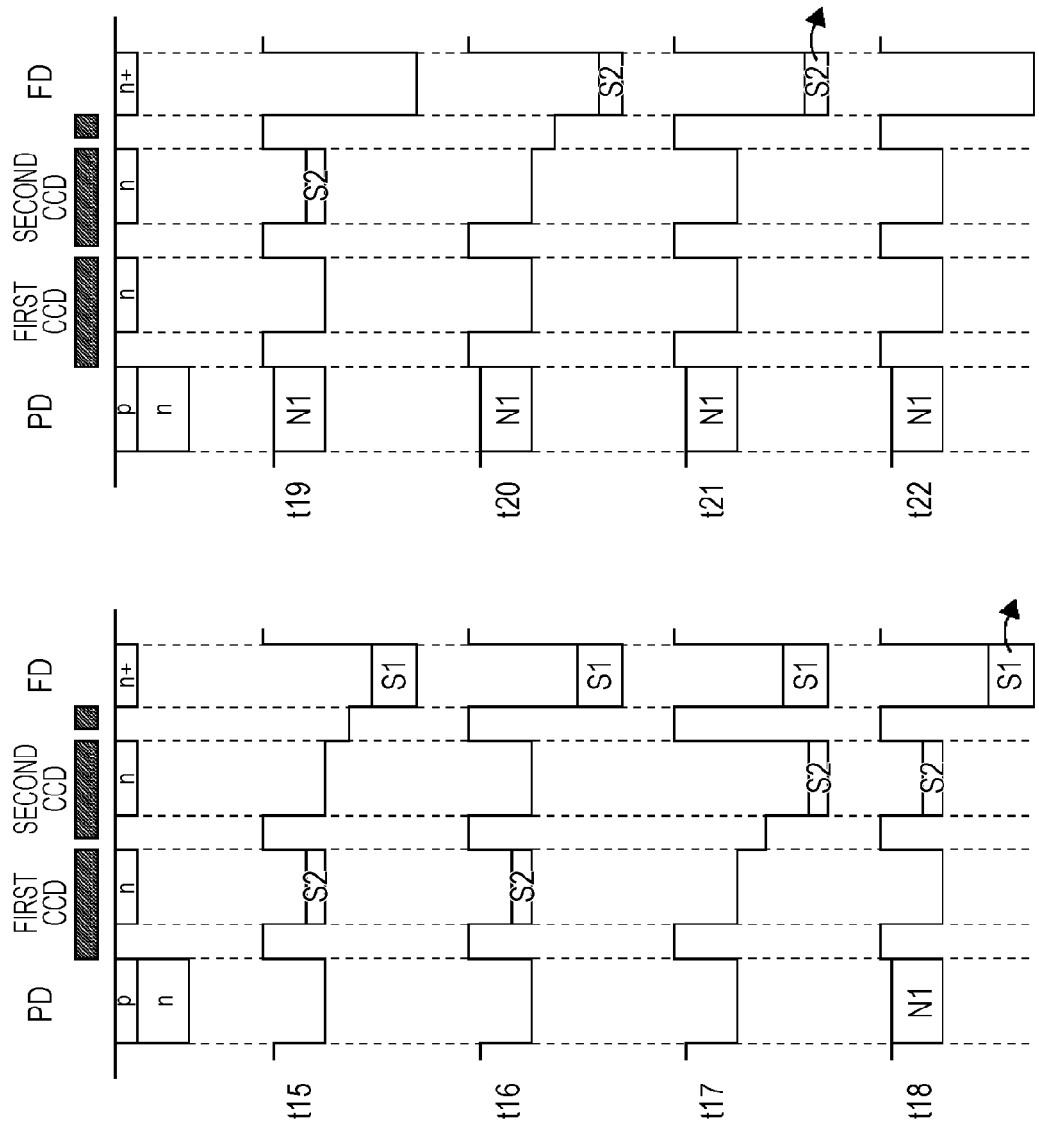
FIG. 7 is a potential diagram for describing the driving process of the solid-state imaging device according to the first embodiment.

Next, a first embodiment of a driving method of the unit pixel 131 of the solid-state imaging device 100 will be described with reference to FIGS. 4 to 7. Here, FIG. 4 is a flow chart for describing the driving process of the unit pixel 131. In addition, FIGS. 5 to 7 are potential diagrams of each section of the unit pixel 131. In the potential diagrams of FIGS. 5 to 7, the vertical axis shows potential and a downward direction means that potential with regard to electrons becomes lower (or higher).

In addition, as shown in FIG. 5, at time t0 before the process of step ST1 of FIG. 4, unnecessary electric charge N0 is accumulated in the photodiode 141 of the respective unit pixels 131 of the solid-state imaging device 100, the first CCD 142, the second CCD 143, and the floating diffusion region 145 are reset, and the electric charge is discharged.

The processes of steps ST1 to S3 of FIG. 4 are processes of an accumulation period where the respective unit pixels 131 accumulate the electric charge corresponding to an amount of incident light and are executed for all pixels simultaneously.

In step ST1, unnecessary electric charge accumulated in the photodiode 141 is discharged and accumulation of a first signal electric charge is started for all pixels simultaneously.

Specifically, at time t1, the transfer pulse TRC1 is applied to the gate electrode 171A, the first CCD gate 171 is turned on, and the unnecessary electric charge N0 accumulated in the photodiode 141 is transferred to the memory section 172 of the first CCD 142.

At time t2, the transfer pulse TRC1 is turned off and the first CCD gate 171 is turned off. From this point in time, the accumulation of the first signal electric charge (referred to below as signal electric charge S1) in the photodiode 141 starts.

At time t3, the transfer pulse TRC2 is applied to the gate electrode 173A, the second CCD gate 173 is turned on, and the unnecessary electric charge N0 accumulated in the memory section 172 of the first CCD 142 is transferred to the memory section 174 of the second CCD 143.

At time t4, the transfer pulse TRC2 is turned off and the second CCD gate 173 is turned off.

At time t5, the transfer pulse TRG is applied to the gate electrode 144A, the transfer gate 144 is turned on, and the unnecessary electric charge N0 accumulated in the memory section 174 of the second CCD 143 is transferred to the floating diffusion region 145.

At time t6, the transfer pulse TRG is turned off and the transfer gate 144 is turned off. In addition, the gate electrode of the reset transistor 146 is applied with the reset pulse RST, the floating diffusion region 145 is reset, and the unnecessary electric charge N0 is discharged from the floating diffusion region 145.

After that, the state of time t6 continues and the signal electric charge S1 is accumulated in the photodiode 141 (time t7).

In step S2, the first signal electric charge is transferred to the second CCD 143 and the accumulation of a second signal electric charge starts for all pixels simultaneously.

Specifically, at time t8 where a predetermined exposure time T1 has elapsed since the start of the accumulation of the signal electric charge S1 in the photodiode 141 at time t2, the transfer pulse TRC1 is applied to the gate electrode 171A and the first CCD gate 171 is turned on. According to this, the signal electric charge S1 accumulated in the photodiode 141 is transferred to the memory section 172 of the first CCD 142. Accordingly, from time t2 to time t8 is the exposure time (referred to below as the exposure time T1) for accumulating the signal electric charge S1.

At time t9, the transfer pulse TRC1 is turned off and the first CCD gate 171 is turned off. From this point in time, the accumulation of the second signal electric charge (referred to below as signal electric charge S2) in the photodiode 141 starts. That is, after the completion of the exposure time T1, the next exposure time promptly starts.

At time t10, the transfer pulse TRC2 is applied to the gate electrode 173A, the second CCD gate 173 is turned on, and the signal electric charge S1 accumulated in the memory section 172 of the first CCD 142 is transferred to the memory section 174 of the second CCD 143.

At time t11, the transfer pulse TRC2 is turned off and the second CCD gate 173 is turned off.

After that, the state of time t11 continues and the signal electric charge S2 is accumulated in the photodiode 141 (time t12).

In step S3, the second signal electric charge is transferred to the first CCD 142 for all pixels simultaneously.

Specifically, at time t13 where a predetermined exposure time T2 has elapsed since the start of the accumulation of the signal electric charge S2 in the photodiode 141 at time t9, the transfer pulse TRC1 is applied to the gate electrode 171A and the first CCD gate 171 is turned on. According to this, the signal electric charge S2 accumulated in the photodiode 141 is transferred to the memory section 172 of the first CCD 142. Accordingly, from time t9 to time t13 is the exposure time (referred to below as the exposure time T2) for accumulating the signal electric charge S2.

At time t14, the transfer pulse TRC1 is turned off and the first CCD gate 171 is turned off. From this point in time, the accumulation of unnecessary electric charge (referred to below as unnecessary electric charge N1) in the photodiode 141 starts. Here, even if the photodiode 141 is saturated due to the unnecessary electric charge N1, the unnecessary electric charge N1 overflowing from the photodiode 141 is discharged to the N-type substrate 181 via the P-type well layer 182 and there is no effect on the signal electric charge held in the memory sections of each CCD.

Due to the processes of steps ST1 to S3 above, the exposure of all of the pixels of the solid-state imaging device 100 is started simultaneously and global exposure where the exposure is completed simultaneously is performed twice in a continuous manner. In addition, the signal electric charges S1 and S2, which are generated by the photodiode 141 in the plurality of continuous exposure times T1 and T2, are accumulated in the memory sections of different respective CCDs.

The processes of steps S4 to S10 are processes of a reading out period where the reading out of electric charges accumulated at the respective unit pixels 131 is performed, and are executed in units of each pixel or a plurality of pixels. In addition, below, an example is shown where the processes are executed for each row. That is, in the example, the processes of steps S4 to S10 are performed for a row of the unit pixels 131 which is a target for the pixel signals being read out (referred to below as the target row).

In step S4, the target row of the unit pixels 131 resets the floating diffusion region 145 and reads out a reset level. Specifically, the reset pulse RST is applied to the gate electrode of the reset transistor 146, the floating diffusion region 145 is reset and electric charge is discharged from the floating diffusion region 145. Then, the selection pulse SEL is applied to the gate electrode of the selection transistor 147. According to this, the pixel signal, which shows the voltage (referred to below as reset level R1) of the floating diffusion region 145 which discharged the electric charge, is output to the vertical signal line 155 from the amplification transistor 148. The column processing circuit 113 reads out the reset level R1 based on the pixel signal. Here, a state where the selection pulse SEL is applied to the gate electrode of the selection transistor 147 continues until step S10.

In step S5, the target row of the unit pixels 131 transfers the first signal electric charge to the floating diffusion region 145 and the second signal electric charge to the second CCD 143.

Specifically, at time t15, the transfer pulse TRG is applied to the gate electrode 144A, the transfer gate 144 is turned on, and the signal electric charge S1 accumulated in the memory section 174 of the second CCD 143 is transferred to the floating diffusion region 145.

At time t16, the transfer pulse TRG is turned off and the transfer gate 144 is turned off. Here, since the selection pulse SEL is applied to the gate electrode of the selection transistor 147, the pixel signal, which shows the voltage (referred to below as signal level S1) of the floating diffusion region 145 which accumulates the signal electric charge S1, is output to the vertical signal line 155 from the amplification transistor 148.

At time t17, the transfer pulse TRC2 is applied to the gate electrode 173A, the second CCD gate 173 is turned on, and the signal electric charge S2 accumulated in the memory section 172 of the first CCD 142 is transferred to the memory section 174 of the second CCD 143.

At time t18, the transfer pulse TRC2 is turned off and the second CCD gate 173 is turned off.

In step S6, the target row of the unit pixels 131 reads out the first signal electric charge. That is, the column processing circuit 113 reads out the signal level S1 based on the pixel signal supplied from the amplification transistor 148 via the vertical signal line 155. In addition, the column processing circuit 113 performs CDS processing by taking the difference between the signal level S1 and the reset level R1 and corrects the signal level S1. The column processing circuit 113 supplies the pixel signal (referred to below as pixel signal S1) which shows the corrected signal level S1 to the output circuit 114.

In step S7, the target row of the unit pixels 131 resets the floating diffusion region 145, discharges the first signal electric charge, and reads out the reset level.

Specifically, at time t19, the reset pulse RST is applied to the gate electrode of the reset transistor 146, the floating diffusion region 145 is reset, and the signal electric charge S1 is discharged from the floating diffusion region 145. Here, since the selection pulse SEL is applied to the gate electrode of the selection transistor 147, the pixel signal, which shows the voltage (referred to below as reset level R2) of the floating diffusion region 145 which discharged the signal electric charge S1, is output to the vertical signal line 155 from the amplification transistor 148. The column processing circuit 113 reads out the reset level R2 based on the pixel signal.

In step S8, the target row of the unit pixels 131 transfers the second signal electric charge to the floating diffusion region 145.

Specifically, at time t20, the transfer pulse TRG is applied to the gate electrode 144A, the transfer gate 144 is turned on, and the signal electric charge S2 accumulated in the memory section 174 of the second CCD 143 is transferred to the floating diffusion region 145.

At time t21, the transfer pulse TRG is turned off and the transfer gate 144 is turned off. Here, since the selection pulse SEL is applied to the gate electrode of the selection transistor 147, the pixel signal, which shows the voltage (referred to below as signal level S2) of the floating diffusion region 145 which accumulates the signal electric charge S2, is output to the vertical signal line 155 from the amplification transistor 148.

In step S9, the target row of the unit pixels 131 reads out the second signal electric charge. That is, the column processing circuit 113 reads out the signal level S2 based on the pixel signal supplied from the amplification transistor 148 via the vertical signal line 155. In addition, the column processing circuit 113 performs CDS processing by taking the difference between the signal level S2 and the reset level R2 and corrects the signal level S2. The column processing circuit 113 supplies the pixel signal (referred to below as pixel signal S2) which shows the corrected signal level S2 to the output circuit 114.

In this manner, the signal electric charges S1 and S2 are transferred in order to the floating diffusion region 145 and the pixel signals S1 and S2 based on the signal electric charges S1 and S2 are individually read out.

In addition, the output circuit 114 performs various forms of signal processing with regard to the pixel signal S1 and the pixel signal S2 or performs a process of generating pixel signals (referred to below as output signals) output externally based on the pixel signal S1 and the pixel signal S2. For example, the output circuit 114 adds together the signal level S1 and the signal level S2, selects one of the signal level S1 and the signal level S2, or takes an average of the signal level S1 and the signal level S2 and sets an output level of the output signal. In addition, in a case when the signal level S1 and the signal level S2 are added together, for example, it is possible to obtain the output level using the equation (1) below.

$$\text{Output level} = \text{signal level } S1 + \text{signal level } S2 \times (\text{exposure time } T1/\text{exposure time } T2) \quad (1)$$

In step S10, the target row of the unit pixels 131 resets the floating diffusion region 145 and discharges the second signal electric charge.

Specifically, at time t22, the reset pulse RST is applied to the gate electrode of the reset transistor 146, the floating diffusion region 145 is reset and the signal electric charge S2 is discharged from the floating diffusion region 145. In addition, the application of the selection pulse SEL to the gate electrode of the selection transistor 147 is stopped.

In step S11, the control circuit 115 determines whether or not the signal electric charge of all of the pixels has been read out. In addition, in the case where the signal electric charge of all of the pixels has not been read out, the process returns to step S4. After that, in step S11, until it is determined that the signal electric charge of all of the pixels has been read out, the processes from step S4 to S11 are repeatedly executed. According to this, the pixel signals S1 and S2 based on the signal electric charges S1 and S2 of the respective unit pixels 131 are read out in order one row at a time.

On the other hand, in step S11, in the case where it is determined that the signal electric charges of all of the pixels have been read out, the process proceeds to step S12.

In step S12, the control circuit 115 determines whether or not to start the next exposure. In the case where it is determined that the next exposure is to be started, the process returns to step ST1 and the processes from step ST1 onward are executed.

On the other hand, in step S12, in the case where it is determined that the next exposure is not to be started, the driving process ends.

In addition, it is possible to set arbitrary times for the exposure time T1 and the exposure time T2. For example, by setting the exposure time T1 and the exposure time T2 to be different times, it is possible to expand the dynamic range of the solid-state imaging device 100. For example, by setting the exposure time T2 to be shorter than the exposure time T1, the pixel signal S1 which corresponds to the exposure time T1 becomes a signal which is able to reproduce a low-luminance subject finely with high sensitivity, and the pixel signal S2 which corresponds to the exposure time T2 becomes a signal which is able to reproduce a high-luminance subject with low sensitivity without saturation. That is, it is possible to obtain a high-sensitivity pixel signal S1 and a low-sensitivity pixel signal S2 for one frame. As a result, by generating the output signals using the two signals, it is possible to generate images with a wide dynamic range.

In addition, it is possible to set the exposure time T2 to be longer than the exposure time T1. However, setting the exposure time T2 to be shorter than the exposure time T1 makes it possible to shorten the time when the signal electric charge S1 is accumulated in the memory section 174 of the second CCD 143. As a result, the electric charge, which is generated by light being incident on a lower portion of the gate electrode 173A due to, for example, reflection or diffraction, leaks into the memory section 174 and it is possible to reduce the amount of noise due to the addition to the signal electric charge S1.

In addition, since it is possible to individually obtain the pixel signal S1 and the pixel signal S2, there is no problem of uncertainty with the separating of the signals and it is possible to perform a more appropriate process for expanding dynamic range with regard to a moving subject or shaking of the camera.

Furthermore, since the exposure time T1 when the signal electric charge S1 is accumulated and the exposure time T2 when the signal electric charge S2 is accumulated are set to the same time for all pixels, it is possible to obtain an image with no distortions with regard to a moving subject.

In addition, in the unit pixel 131, the unnecessary electric charge accumulated in the photodiode 141 is discharged after being transferred to the floating diffusion region 145 via the first CCD 142 and the second CCD 143 rather than being discharged after being transferred to an electric charge discharging section as in Japanese Publication No. JP 2009-296574. Accordingly, with regard to a path for discharging the electric charge overflowing from the photodiode 141 to the N-type substrate 181, it is not necessary for it to be possible to completely transfer the electric charge accumulated in the photodiode 141. That is, it is not necessary for it to be possible to completely transfer the electric charge from the photodiode 141 in a plurality of directions and it is sufficient if it is possible to completely transfer only in the direction of the first CCD 142. Accordingly, it becomes easy to form a distribution of impurities in the photodiode 141. Furthermore, in order to discharge the unnecessary electric charge from the photodiode 141, it is not necessary to provide a dedicated transistor or perform controlling of supply of a dedicated pulse signal.

Second Embodiment of Driving Method of Unit Pixel 131

Figure 8:
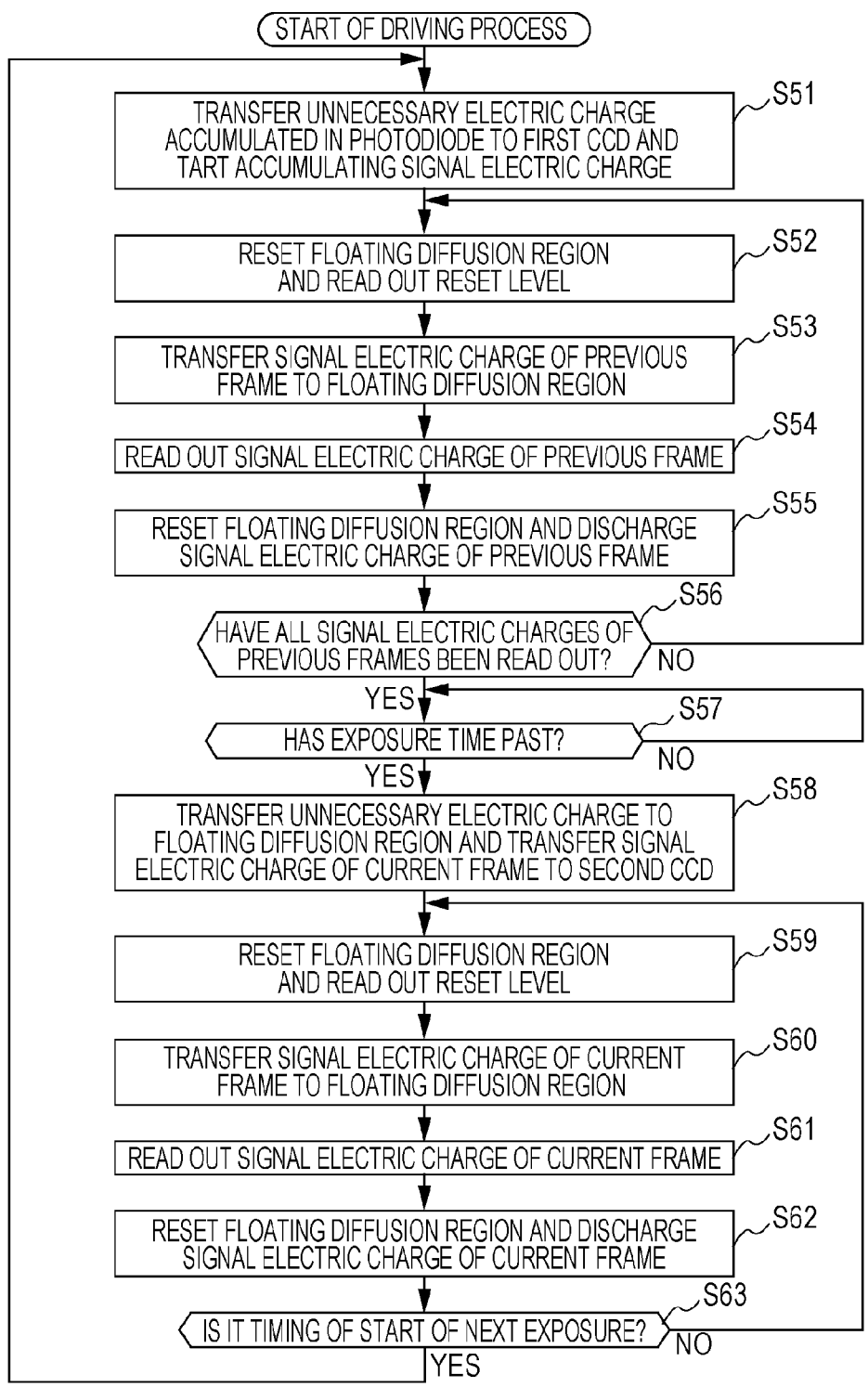
FIG. 8 is a flow chart for describing a driving process of a solid-state imaging device according to a second embodiment.
Figure 9:
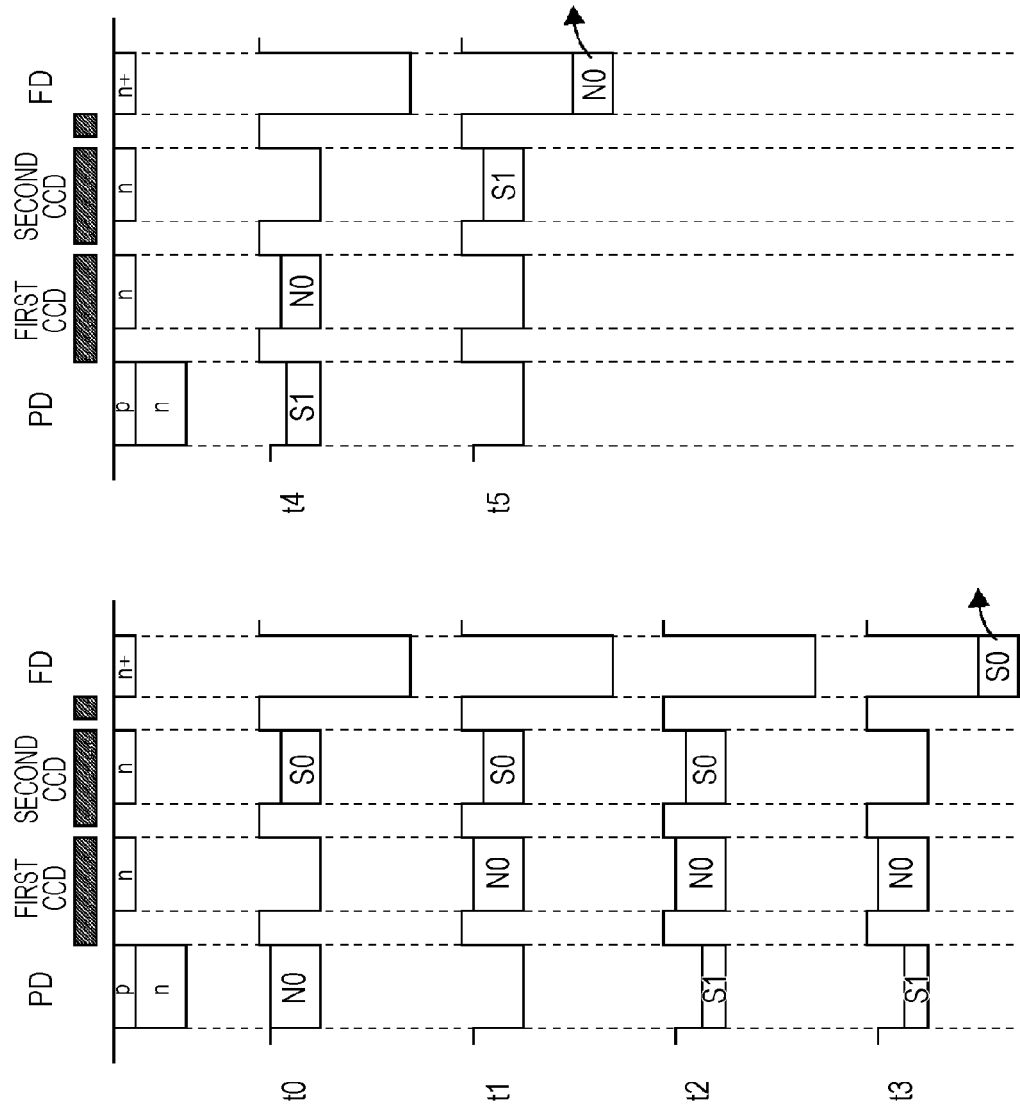
FIG. 9 is a potential diagram for describing the driving process of the solid-state imaging device according to the second embodiment.
Figure 10:
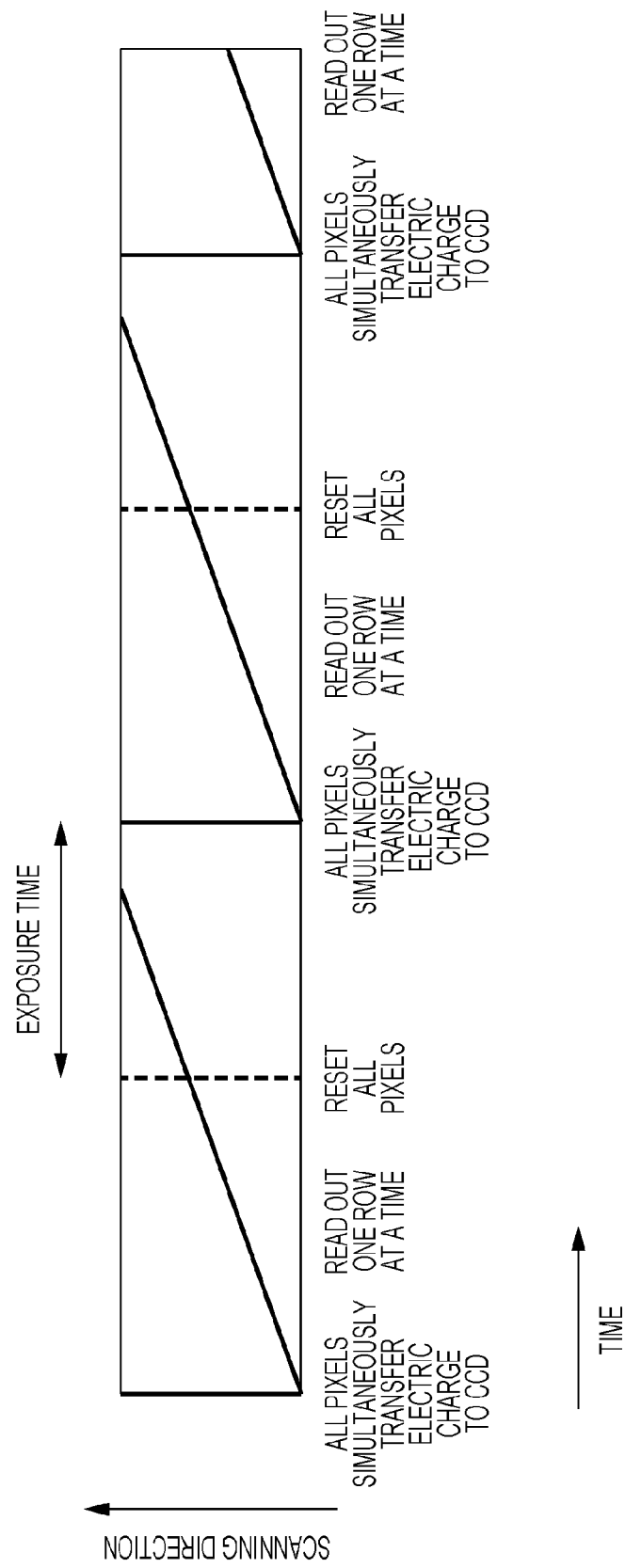
FIG. 10 is a timing chart for describing the driving process of the solid-state imaging device according to the second embodiment.

Next, a second embodiment of a driving method of the unit pixel 131 of the solid-state imaging device 100 will be described with reference to FIGS. 8 to 10. Here, FIG. 8 is a flow chart for describing the driving process of the unit pixel 131. In addition, FIG. 9 is a potential diagram of each section of the unit pixel 131. In the potential diagram of FIG. 9, the vertical axis shows potential and a downward direction means that potential with regard to electrons becomes lower (or higher). Furthermore, FIG. 10 is a timing chart for describing the driving process of the unit pixel 131. The horizontal direction of FIG. 10 shows time and the vertical direction shows the scanning direction.

In addition, in the second embodiment, there are two unit pixels 131; the unit pixel 131 where the next exposure is started before the signal electric charge is read out and the unit pixel 131 where the next exposure is started after the signal electric charge is read out. FIG. 9 shows a potential diagram of the unit pixel 131 where the next exposure is started before the signal electric charge is read out. Then, in the example of FIG. 9, at time t0 before the process of step S51 of FIG. 8, the unnecessary electric charge N0 is accumulated in the photodiode 141 of the unit pixel 131, a signal electric charge S0 of the previous frame is accumulated in the memory section 174 of the second CCD 143, the first CCD 142 and the floating diffusion region 145 are reset, and the electric charge is discharged. In addition, in a case of the unit pixel 131 where the next exposure is started after the signal electric charge is read out, there is a state at time t0 where the signal electric charge S0 of the previous frame is not accumulated in the memory section 174 of the second CCD 143.

In addition, in FIG. 9, different to FIGS. 5 to 7, the process of transferring the electric charge is omitted from the diagram and the description is also omitted.

In step S51, unnecessary electric charge accumulated in the photodiode 141 is transferred to the first CCD 142 and accumulation of a signal electric charge is started for all pixels simultaneously.

Specifically, at time t1, the unnecessary electric charge N0 accumulated in the photodiode 141 is transferred to the memory section 172 of the first CCD 142 and the accumulation of a signal electric charge S1 in the photodiode 141 is started for all pixels simultaneously. The process is equivalent to the "reset all pixels" of FIG. 10.

The processes from steps S52 to S55 are processes for performing reading out of the signal electric charges of the unit pixels 131 where the signal electric charge of the previous frame has not yet been read out at a point in time when all of the pixels are reset, and are executed in units of each pixel or a plurality of pixels. In addition, below, an example is shown where the processes are executed for each row. That is, in the example, the processes of steps S52 to S55 are performed for a target row of the unit pixels 131 which is a target for the pixel signals being read out.

In step S52, using a process similar to step S4 of FIG. 4, the target row of the unit pixels 131 resets the floating diffusion region 145 and reads out a reset level (referred to below as reset level R0). Here, at this time, a state, where the selection pulse SEL is applied to the gate electrodes of the selection transistors 147 of the unit pixels 131 of the target row, continues until step S55.

In step S53, the target row of the unit pixels 131 transfers the signal electric charge of the previous frame to the floating diffusion region 145.

Specifically, at time t3, the signal electric charge S0 of the previous frames, which is accumulated in the memory sections 174 of the second CCDs 143 of the respective unit pixels 131 of the target row, is transferred to the floating diffusion regions 145. Here, since the selection pulse SEL is applied to the gate electrode of the selection transistor 147, the pixel signal, which shows the voltage (referred to below as signal level S0) of the floating diffusion region 145 which accumulates the signal electric charge S0, is output to the vertical signal line 155 from the amplification transistor 148.

In step S54, the target row of the unit pixels 131 reads out the signal electric charge of the previous frame. That is, the column processing circuit 113 reads out the signal level S0 based on the pixel signal supplied from the amplification transistor 148 via the vertical signal line 155. In addition, the column processing circuit 113 performs CDS processing by taking the difference between the signal level S0 and the reset level R0 and corrects the signal level S0. The column processing circuit 113 supplies the pixel signal (referred to below as pixel signal S0) which shows the corrected signal level S0 to the output circuit 114. In addition, the output circuit 114 performs various signal processes with regard to the pixel signal S0 or performs a process of generating an output signal output externally based on the pixel signal S0.

In step S55, the target row of the unit pixels 131 resets the floating diffusion region 145 and discharges the signal electric charge of the previous frame.

Specifically, at time t4, the reset pulse RST is applied to the gate electrode of the reset transistor 146, the floating diffusion region 145 is reset, and the signal electric charge S0 is discharged from the floating diffusion region 145. In addition, the application of the selection pulse SEL to the gate electrode of the selection transistor 147 is stopped.

In step S56, the control circuit 115 determines whether or not the signal electric charges of the previous frames have all been read out. In the case where it is determined that the signal electric charge of the previous frames has not all been read out, the process returns to step S52. After that, in step S56, until it is determined that the signal electric charge of the previous frames has all been read out, the processes from step S52 to S56 are repeatedly executed. According to this, with regard to the rows where the signal electric charge S0 of the previous frame has not yet been read out, the pixel signal S0 based on the signal electric charge S0 of the respective unit pixels 131 is read out in order one row at a time.

On the other hand, in step S56, in the case where it is determined that the signal electric charge of the previous frames has all been read out, the process proceeds to step S57.

In step S57, the control circuit 115 determines whether or not the exposure time has elapsed. Specifically, for example, at predetermined intervals, the control circuit 115 repeats a determination process of whether or not a predetermined exposure time T has elapsed since time t1, and in the case where it is determined that the predetermined exposure time T has elapsed since time t1, the process proceeds to step S58.

In step S58, unnecessary electric charge is transferred to the floating diffusion region 145 and the signal electric charge of the current frame is transferred to the second CCD 143 for all pixels simultaneously.

Specifically, at time t5 when the predetermined exposure time T has elapsed since time t1, the unnecessary electric charge N0 accumulated in the memory section 172 of the first CCD 142 is transferred to the floating diffusion region 145. In addition, a signal electric charge S1 of the current frame accumulated in the photodiode 141 is transferred to the memory section 174 of the second CCD 143. Accordingly, from time t1 to time t5 becomes an exposure time (referred to below as exposure time T) for accumulating the signal electric charge S1. In addition, the process is equivalent to the "all pixels simultaneously transfer electric charge to CCD" of FIG. 10.

The processes of steps S59 to S62 are processes where the reading out of the signal electric charge of the current frame is performed, and are executed in units of each pixel or a plurality of pixels. In addition, below, an example is shown where the processes are executed for each row. That is, in the example, the processes of steps S59 to S62 are performed for a target row of the unit pixels 131 which is a target for the pixel signals being read out.

In step S59, using a process similar to step S4 of FIG. 4, the target row of the unit pixels 131 resets the floating diffusion region 145 and reads out a reset level (referred to below as reset level R1). At this time, the unnecessary electric charge N0 is discharged from the floating diffusion region 145. In addition, at this time, a state, where the selection pulse SEL is applied to the gate electrodes of the selection transistors 147 of the unit pixels 131 of the target row, continues until step S62.

In step S60, using a process similar to step S53, the target row of the unit pixels 131 transfers the signal electric charge S1 of the current frame from the memory section 174 of the second CCD 142 to the floating diffusion region 145. Here, since the selection pulse SEL is applied to the gate electrode of the selection transistor 147, the pixel signal, which shows the voltage (referred to below as signal level S1) of the floating diffusion region 145 which accumulates the signal electric charge S1, is output to the vertical signal line 155 from the amplification transistor 148.

In step S61, the target row of the unit pixels 131 reads out the signal electric charge of the current frame. That is, the column processing circuit 113 reads out the signal level S1 based on the pixel signal supplied from the amplification transistor 148 via the vertical signal line 155. In addition, the column processing circuit 113 performs CDS processing by taking the difference between the signal level S1 and the reset level R1 and corrects the signal level S1. The column processing circuit 113 supplies the pixel signal (referred to below as pixel signal S1) which shows the corrected signal level S1 to the output circuit 114. In addition, the output circuit 114 performs various signal processes with regard to the pixel signal S1 or performs a process of generating an output signal output externally based on the pixel signal S1.

In step S62, using a process similar to step S55, the target row of the unit pixels 131 resets the floating diffusion region 145, discharges the signal electric charge S1 of the current frame, and the application of the selection pulse SEL to the gate electrode of the selection transistor 147 is stopped.

In step S63, the control circuit 115 determines whether or not it is a timing to start the next exposure. In the case where it is determined that it is not yet the timing to start the next exposure, the process returns to step S59. After that, in step S63, until it is determined that it is the timing to start the next exposure, the processes from step S59 to S63 are repeatedly executed. According to this, the pixel signal based on the signal electric charge S1 of the respective unit pixels 131 is read out in order one row at a time.

On the other hand, in step S63, in the case where it is determined that it is the timing to start the exposure of the next frame, the process returns to step S51 and the processes from step S51 onward are executed. That is, during execution of the reading out process, exposure of the next frame is started and a process of accumulating the signal electric charge of the next frame is started.

In this manner, by providing two CCDs, the first CCD 142 and the second CCD 143, as shown in FIG. 10, it is possible to reset the photodiode 141 and start exposure of the next frame for all pixels simultaneously in parallel with the process of reading out the signal charge one row at a time. In addition, it is possible to match the exposure time of all pixels. That is, moving image imaging, where a global shutter and an arbitrary exposure time for one frame are compatible, is possible.

In addition, as shown in FIG. 10, the reading out of the signal electric charge is promptly performed after the transferring of the signal electric charge accumulated in the photodiode 141 to the memory section 174 of the second CCD 143. According to this, it is possible to reduce the time accumulating the signal electric charge in the memory section 174. As a result, the electric charge, which is generated by light being incident on a lower portion of the gate electrode 173A due to, for example, reflection or diffraction, leaks into the memory section 174 and it is possible to reduce the amount of noise due to the adding to the signal electric charge S1. On the other hand, in the invention disclosed in Japanese Publication No. JP 2009-296574, after the signal electric charge accumulated in the photodiode is transferred, since the reading out of the signal electric charge is performed after the discharge of unnecessary electric charge to the electric charge discharging section, time accumulating the signal electric charge in the memory section is longer.

In addition, in the same manner to the first embodiment of the driving method of the unit pixel 131, since the unnecessary electric charge is discharged after being transferred to the floating diffusion region 145 via the first CCD 142 and the second CCD 143, it becomes easy to form a distribution of impurities in the photodiode 141. Furthermore, in order to discharge the unnecessary electric charge from the photodiode 141, it is not necessary to provide a dedicated transistor or perform controlling of supply of a dedicated pulse signal.

In addition, it is possible to adjust the timing of performing the resetting of all pixels and starting exposure to an arbitrary position of one frame with the time of scanning one row as a unit and it is possible to adjust the exposure time according to, for example, the luminance of the subject.

2. Modified Examples

In addition, in the description above, the example is shown where two levels of CCDs are provided, but three or more levels may be provided. For example, by providing three levels of CCDs and accumulating three signal electric charges with different exposure times in the respective CCDs, it is possible to obtain pixel signals with high sensitivity, intermediate sensitivity, and low sensitivity, and it is possible to further expand the dynamic range. In addition, in this case, in the three continuous exposure times, it is desirable for the time of the later exposure times to be shorter.

In addition, for example, by providing three levels of CCDs, it is possible to combine the first embodiment and the second embodiment of the driving methods of the unit pixel 131. Specifically, for example, it is possible to divide one frame period into three periods, perform exposure, and accumulate the unnecessary electric charge, the high-sensitivity signal electric charge with a long exposure time, and the low-sensitivity signal electric charge with a short exposure time in the respective CCDs. According to this, it is possible to perform moving image imaging, where a global shutter and an arbitrary exposure time for one frame are compatible, and to expand the dynamic range.

Furthermore, in the description above, the example is shown where electric charge overflowing from the photodiode 141 is discharged to the N-type substrate 181. However, an electric charge discharging section may be provided at a side of the photodiode 141 and the electric charge may be discharged to the electric charge discharging section, or the discharge amount may be controlled. However, as described above, it is not necessary for it to be possible to completely transfer the electric charge accumulated in the photodiode 141 to the electric charge discharging section.

In addition, in the description above, the example is shown where the gate electrodes of each CCD are configured by one sheet, but may be provided as being divided into two sheets for the transfer gates and the memory sections.

Furthermore, "all pixels" in the embodiments refers to all pixels in a portion which appears in an image and dummy pixels and the like are excluded. In addition, the high-speed scanning in a plurality of rows (for example, several tens of rows) at a time is included instead of the operation of all pixels simultaneously if time difference and image distortions are small enough to not be a problem. Furthermore, in the embodiments, it is possible to apply a global shutter operation with regard to a predetermined plurality of rows without being limited to all pixels which appear in an image.

In addition, in the description above, in step ST1 of FIG. 4, the example is shown where the unnecessary electric charge N0 accumulated in the photodiode 141 is transferred until the floating diffusion region 145 and promptly discharged, but it is not necessary for the unnecessary electric charge to be promptly discharged. That is, it is possible for the unnecessary electric charge N0 to be accumulated for a while in the memory section 172 of the first CCD 142, the memory section 173 of the second CCD 143, or the floating diffusion region 145 before being discharged within the scope in which the transferring and accumulating of the signal electric charge S1 is not hindered.

Furthermore, in the description above, in step S59 of FIG. 8, the example is shown where the unnecessary electric charge N0 is discharged from the floating diffusion region 145 when the reset level R1 is read out, but it is also possible for the unnecessary electric charge N0 to be discharged beforehand. More specifically, at time t4, it is possible to discharge the unnecessary electric charge N0 beforehand at an arbitrary timing from when the signal electric charge S0 is discharged from the floating diffusion region 145 until when the reset level R1 is read out.

In addition, the conductivity types of the device configuration of the unit pixel 131 shown above are only one example, and the N-type and the P-type may be reversed.

Furthermore, the invention is not limited to being applied to the solid-state imaging device. That is, it is possible for the invention to be applied with regard to general electronic apparatuses using the solid-state imaging device in an image obtaining section (photoelectric converter) such as an imaging device such as a digital still camera and a video camera, a mobile phone terminal device with an imaging function, and a copying device using the solid-state imaging device in an image obtaining section. The solid-state imaging device may be a configuration formed as one chip or a configuration with a module which has an imaging function where an imaging section and a signal processing section or an optical system are combined and packaged.

Configuration Example of Electronic Apparatus of Embodiment

Figure 11:
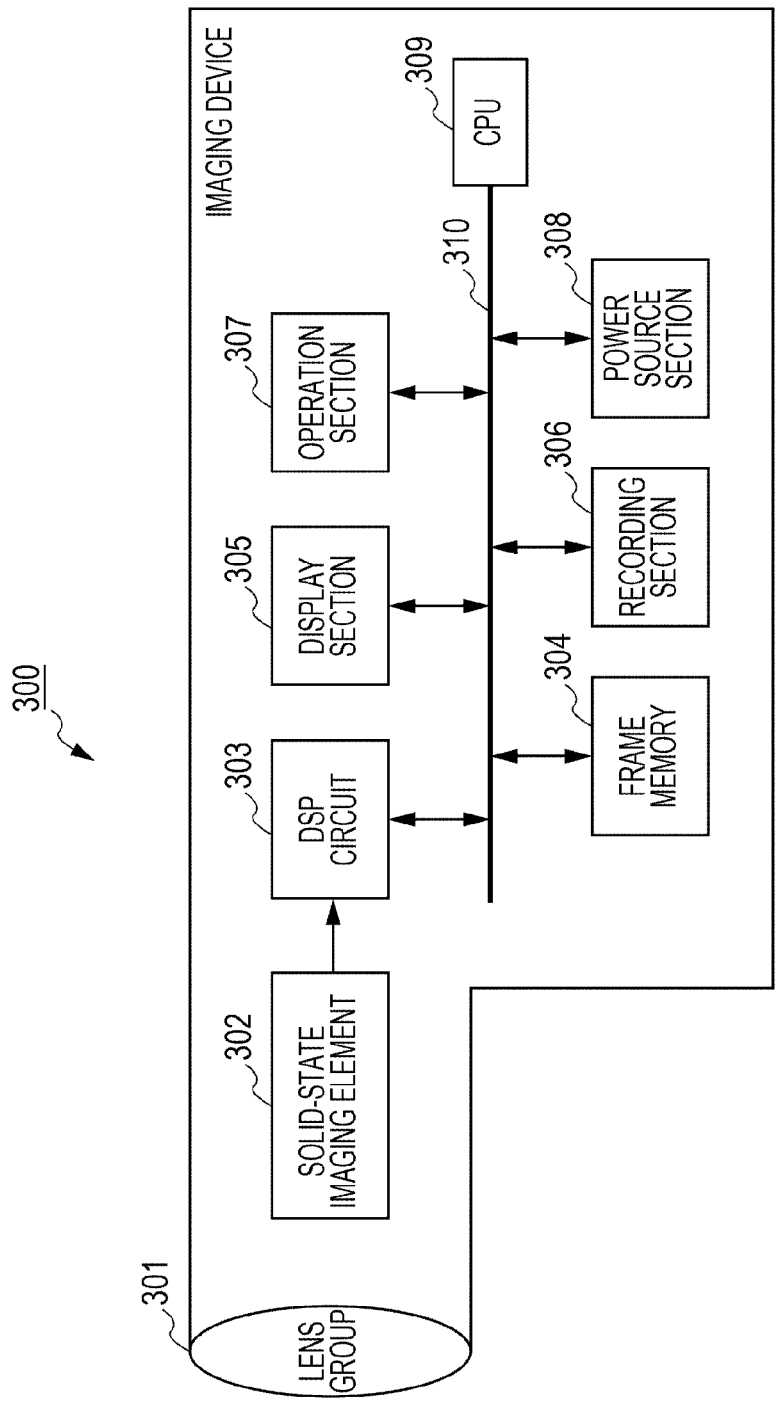
FIG. 11 is a block diagram illustrating a configuration example of an electronic apparatus according to an embodiment of the invention.

FIG. 11 is a block diagram illustrating a configuration example of an imaging device as an electronic apparatus according to an embodiment of the invention.

An imaging device 300 of FIG. 11 is provided with an optical section 301 formed from a set of lenses and the like, a solid-state imaging element (imaging device) 302 which adopts each configuration of the unit pixel 131 described above, a DSP (Digital Signal Processor) circuit 303 which is a camera signal processing circuit. In addition, the imaging device 300 is also provided with a frame memory 304, a display section 305, a recording section 306, an operation section 307, a power source section 308, and a CPU 309. The DSP circuit 303, the frame memory 304, the display section 305, the recording section 306, the operation section 307, the power source section 308, and the CPU 309 are connected to each other by a bus line 310.

The optical section 301 takes in incident light (image light) from a subject and images on an imaging surface of the solid-state imaging element 302. The solid-state imaging element 302 converts the amount of incident light imaged on the imaging surface by the optical section 301 into an electric signal in pixel units and outputs the electric signal as a pixel signal. As the solid-state imaging element 302, it is possible to use a solid-state imaging element such as the solid-state imaging device 100 according to the embodiments described above, that is a solid-state imaging element which is able to realize an image with no distortions using a global exposure.

The display section 305 is formed from a panel-type display device such as a liquid crystal panel or an EL (electro luminescence) panel, and displays moving images or still images imaged by the solid-state imaging element 302. The recording section 306 records moving images or still images imaged by the solid-state imaging element 302 in a recording medium such as a video tape or a DVD (Digital Versatile Disc).

The operation section 307 gives out operation commands under the operation of a user with regard to various functions that the imaging device 300 has. The power source section 308 appropriately supplies various power sources with regard to the DSP circuit 303, the frame memory 304, the display section 305, the recording section 306, and the operation power source of the operation section 307. The CPU 309 controls the operations of the entire imaging device 300.

As described above, by using the solid-state imaging device 100 according to the embodiments described above as the solid-state imaging element 302, it is possible to secure a high S/N and to expand the dynamic range while securing synchronization in the plane of the exposure time, and it is possible to secure a high S/N and to obtain moving images where synchronization in the plane and an arbitrary exposure time for one frame are compatible. Accordingly, even in the imaging device 300 such as a video camera, a digital still camera, and also a camera module for a mobile device such as a mobile phone terminal device, it is possible to achieve higher image quality for imaging images.

In addition, in the embodiments described above, an example is used and described where a CMOS image sensor is applied where unit pixels, which detect signal electric charge corresponding to an amount of visible light as a physical amount, arranged in a row and column formation. However, the invention is not limited to being applied to a CMOS image sensor, and it is possible for the invention to be applied with regard to general solid-state imaging devices with a column method where a column processing section is arranged for each pixel column of a pixel array section.

Furthermore, the invention is not limited to being applied to the solid-state imaging device where a distribution of an amount of incident visible light is detected and imaged as an image and it is possible for the invention to be applied with regard to general solid-state imaging elements (physical amount distribution detection devices) such as a solid-state imaging device where a distribution of an amount of incident light of infrared, X-rays, particles or the like is imaged as an image or a fingerprint detecting sensor where a distribution of a broad meaning of other physical amounts such as pressure or capacitance is changed into an electric signal, is subjected to time integration, and is imaged as an image.

Here, in the specifications, the steps described in the flow charts may of course be performed in a times series in line with the described order, and even if not necessarily processed in a time series, may be executed at a necessary timing such as being performed in parallel or when called up.

The present application contains subject matter related to that disclosed in Japanese Priority Patent Application JP 2010-085981 filed in the Japan Patent Office on Apr. 2, 2010, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A solid-state imaging device comprising:
    a plurality of unit pixels arranged two-dimensionally in rows and columns, each unit pixel including (i) a photoelectric conversion element, (ii) a plurality of electric charge transferring and accumulating units that are each configured to transfer and accumulate an electric charge that is generated in the photoelectric conversion element, and (iii) a floating diffusion region that holds the electric charge transferred from the photoelectric conversion element via the electric charge transferring and accumulating units so as to be read out as a signal, wherein, the solid-state imaging device is configured such that (i) all of the plurality of unit pixels simultaneously transfer in order a plurality of signal electric charges to the plurality of electric charge transferring and accumulating units in each respective unit pixel, the plurality of signal electric charges being generated in the photoelectric conversion element of each unit pixel of the plurality of unit pixels during a plurality of continuous exposure times of which each has a different duration, and being accumulated in different respective electric charge transferring and accumulating units of the unit pixel, (ii) in each unit pixel of a target plurality of unit pixels, the plurality of signal electric charges are transferred to the floating diffusion region in the order of being transferred to the electric charge transferring and accumulating units and a plurality of signals respectively corresponding to the plurality of signal electric charges are read out from the floating diffusion region, and (iii) the floating diffusion region is reset before each of the plurality of signals are read out from the floating diffusion region, and the solid-state imaging device is further configured such that, in addition to the floating diffusion region being reset before the readout of each of the plurality of signals therefrom, the photoelectric conversion element in each unit pixel of the plurality of unit pixels is reset, the photoelectric conversion element being reset such that unnecessary electric charge accumulated in the photoelectric conversion element is transferred via the plurality of electric charge transferring and accumulating units to the floating diffusion region to be discharged from the floating diffusion region, the unnecessary electric charge being transferred to a first one out of the plurality of electric charge transferring and accumulating units before a first exposure time out of the plurality of continuous exposure times starts.

2. The solid-state imaging device according to claim 1, wherein the plurality of continuous exposure times include at least the first exposure time and a second exposure time, the second exposure time having a shorter duration than the first exposure time.

3. A driving method of a solid-state imaging device including a plurality of unit pixels arranged two-dimensionally in rows and columns, each unit pixel including (i) a photoelectric conversion element, (ii) a plurality of electric charge transferring and accumulating units that are each configured to transfer and accumulate an electric charge that is generated in the photoelectric conversion element, and (iii) floating diffusion region that holds the electric charge transferred from the photoelectric conversion element via the electric charge transferring and accumulating units so as to be read out as a signal, the method comprising:

transferring, by all of the plurality of unit pixels simultaneously, in order a plurality of electric charges to the plurality electric charge transferring and accumulating units in each respective unit pixel, the plurality of signal electric charges being generated in the photoelectric conversion element of each unit pixel of the plurality of unit pixels during a plurality of continuous exposure times of which each has a different duration, and being accumulated in different respective electric charge transferring and accumulating units of the unit pixel; and in each unit pixel of a target plurality of unit pixels, transferring the plurality of electric charges to the floating diffusion region in the order of being transferred to the electric charge transferring and accumulating units and reading out a plurality of signals respectively corresponding to the plurality of signal electric charges from the floating diffusion region, the floating diffusion region being reset before each of the plurality of signals is read out from the floating diffusion region, wherein, in addition to the floating diffusion region being reset before the readout of each of the plurality of signals therefrom, the method further comprises resetting the photoelectric conversion element in each unit pixel, the photoelectric conversion element being reset such that unnecessary electric charge accumulated in the photoelectric conversion element is transferred via the plurality of electric charge transferring and accumulating units to the floating diffusion region to be discharged from the floating diffusion region, the unnecessary electric charge being transferred to a first one out of the plurality of electric charge transferring and accumulating units before a first exposure time out of the plurality of continuous exposure times starts.

4. The driving method of a solid-state imaging device according to claim 3, wherein the plurality of continuous exposure times include at least the first exposure time and a second exposure time, the second exposure time having a shorter duration than the first exposure time.

5. An electronic apparatus comprising:

a solid-state imaging device including a plurality of unit pixels, each unit pixel including (i) a photoelectric conversion element, (ii) a plurality of electric charge transferring and accumulating units that are each configured to transfer and accumulate an electric charge that is generated in the photoelectric conversion element, and (iii) a floating diffusion region that holds the electric charge transferred from the photoelectric conversion element via the electric charge transferring and accumulating units so as to be read out as a signal, wherein, the solid-state imaging device is configured such that (i) all of the plurality of unit pixels simultaneously transfer in order a plurality of signal electric charges to the plurality of electric charge transferring and accumulating units in each respective unit pixel, the plurality of signal electric charges being generated in the photoelectric conversion element of each unit pixel of the plurality of unit pixels during a plurality of continuous exposure times of which each has a different duration, and being accumulated in different respective electric charge transferring and accumulating units of the unit pixel, and (ii) in each unit pixel of a target plurality of unit pixels, the plurality of signal electric charges are transferred to the floating diffusion region in the order of being transferred to the electric charge transferring and accumulating units and a plurality of signals respectively corresponding to the plurality of signal electric charges are read out from the floating diffusion region, and (iii) the floating diffusion region is reset before each of the plurality of signals are read out from the floating diffusion region, and the solid-state imaging device is further configured such that, in addition to the floating diffusion region being reset before the readout of each of the plurality of signals therefrom, the photoelectric conversion element in each unit pixel of the plurality of unit pixels is reset, the photoelectric conversion element being reset such that unnecessary electric charge accumulated in the photoelectric conversion element is transferred via the plurality of electric charge transferring and accumulating units to the floating diffusion region to be discharged from the floating diffusion region, the unnecessary electric charge being transferred to a first one out of the plurality of electric charge transferring and accumulating units before a first exposure time out of the plurality of continuous exposure times starts.

\* \* \* \* \*